United States Patent
Takemura

(10) Patent No.: US 9,064,473 B2
(45) Date of Patent: Jun. 23, 2015

(54) ELECTRO-OPTICAL DISPLAY DEVICE AND DISPLAY METHOD THEREOF

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 310 days.

(21) Appl. No.: 13/100,803

(22) Filed: May 4, 2011

(65) Prior Publication Data

US 2011/0279356 A1    Nov. 17, 2011

(30) Foreign Application Priority Data

May 12, 2010 (JP) .................................. 2010-109825

(51) Int. Cl.
  *G09G 3/36* (2006.01)
  *G02F 1/1362* (2006.01)
  (Continued)

(52) U.S. Cl.
  CPC .......... *G09G 3/3659* (2013.01); *G02F 1/13624* (2013.01); *G02F 2001/136245* (2013.01); *G09G 2300/0809* (2013.01); *H01L 29/7869* (2013.01); *G02F 1/136259* (2013.01);
  (Continued)

(58) Field of Classification Search
  CPC ............ G09G 3/30; G09G 2300/0842; G09G 3/3659; G09G 2300/0809; G02F 1/13624; G02F 2001/136245; G02F 1/136259; G02F 1/136286; G02F 2001/13606; G02F 2001/136295; G02F 2001/13793; H01L 27/1255; H01L 29/7869; H04N 13/0438
  USPC .................. 345/77–82, 87, 92, 204
  See application file for complete search history.

(56) References Cited

U.S. PATENT DOCUMENTS 5,627,557 A    5/1997   Yamaguchi et al.
5,731,856 A    3/1998   Kim et al.
(Continued)

FOREIGN PATENT DOCUMENTS

EP    0586155 A    3/1994
EP    1737044 A    12/2006
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

Primary Examiner — Towfiq Elahi
(74) Attorney, Agent, or Firm — Eric J. Robinson; Robinson Intellectual Property Law Office, P.C.

(57) ABSTRACT

A method of reducing power consumption of an electro-optical display device which can display a still image with the use of analog signals. A circuit in which a small amount of leakage current flows between a source and a drain of a selection transistor when the selection transistor is off; the source of the selection transistor is connected to a gate of an N-channel driving transistor, a gate of a P-channel driving transistor, and one electrode of a capacitor; and a source of each of the N-channel driving transistor and the P-channel driving transistor is connected to one electrode of a display element is provided in each pixel. The longest time of one frame is set to 100 seconds or longer with the use of such a circuit, whereby power consumption at the time of rewriting is reduced.

33 Claims, 15 Drawing Sheets

(51) Int. Cl.
*H01L 27/12* (2006.01)
*H01L 29/786* (2006.01)
*G02F 1/136* (2006.01)
*G02F 1/137* (2006.01)
*H04N 13/04* (2006.01)

(52) U.S. Cl.
CPC ............... *G02F 1/136286* (2013.01); *G02F 2001/13606* (2013.01); *G02F 2001/136295* (2013.01); *G02F 2001/13793* (2013.01); *H04N 13/0438* (2013.01); *H01L 27/1255* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,864,637 | B2 * | 3/2005 | Park et al. ............... 315/169.1 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,321,353 | B2 | 1/2008 | Tsuda et al. |
| 7,323,356 | B2 | 1/2008 | Hosono et al. |
| 7,362,304 | B2 | 4/2008 | Takatori et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0075221 | A1 * | 6/2002 | Waterman ............... 345/99 |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0174313 | A1 * | 8/2005 | Kawachi ............... 345/98 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0164359 | A1 * | 7/2006 | Kimura ............... 345/92 |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0170022 | A1 * | 7/2008 | Chen et al. ............... 345/92 |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0289887 | A1 * | 11/2009 | Lu et al. ............... 345/98 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0220889 | A1 | 9/2011 | Kurokawa et al. |
| 2011/0221724 | A1 | 9/2011 | Kurokawa et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-118912 A | 4/1994 |
| JP | 07-022627 A | 1/1995 |
| JP | 08-264794 A | 10/1996 |
| JP | 09-321305 A | 12/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |
| WO | WO 2011/111506 | 9/2011 |
| WO | WO 2011/111529 | 9/2011 |

OTHER PUBLICATIONS

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the $In_2O_3$-$Ga_2ZnO_4$-$ZnO$ system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-$ZnO$ System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$-$In_2O_3$-$ZnO$) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe2O4, and Yb2Fe3O7 Types of Structures for Compounds in the IN2O3 and Sc2O3-A2O3-BO Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

ELECTRO-OPTICAL DISPLAY DEVICE AND DISPLAY METHOD THEREOF

BACKGROUND OF THE INVENTION

1. Field of the Invention

The present invention relates to a display device utilizing electrical response characteristics of a material. The present invention relates to, for example, a liquid crystal display device or the like.

2. Description of the Related Art

In an active matrix liquid crystal display device which is a typical electro-optical display device, a circuit including a transistor $WTr_{(n,m)}$, a capacitor (also referred to as a storage capacitor) $C_{(n,m)}$, and a liquid crystal display element $LC_{(n,m)}$ as illustrated in FIG. 2A is provided in each pixel.

FIG. 2B is an equivalent diagram illustrating a state where the circuit holds charges. The capacitor $C_{(n,m)}$ has capacitance $C_1$ and resistance $R_1$, the liquid crystal display element $LC_{(n,m)}$ has capacitance $C_2$ and resistance $R_2$, and the transistor $WTr_{(n,m)}$ has resistance $R_3$. The capacitance $C_1$ of the capacitor $C_{(n,m)}$ is usually several times or more as high as the capacitance $C_2$ of the liquid crystal display element $LC_{(n,m)}$.

Ideally, it is desirable that the resistance $R_1$, $R_2$, or $R_3$ be infinite. In such a case, the display element $LC_{(n,m)}$ can hold charges semi-permanently. In other words, display can be performed semi-permanently. In fact, however, these resistance components have finite values, and leakage current flows through resistors. Accordingly, charges stored in the display element $LC_{(n,m)}$ change with time; thus, regular rewriting (or additional writing) is required. A method for stabilizing the potential of the display element $LC_{(n,m)}$ is disclosed in Patent Document 1.

In general liquid crystal display devices, rewriting of images is performed about 60 times per second (60 Hz driving) or more especially in the case of displaying a moving image. In that case, the rewriting is performed every 16.7 milliseconds (one frame). In such frequent rewriting (or short frame period), variation in luminance or the like of a display element in one frame usually cannot be recognized, and the above-described variation in the charge stored in the display element $LC_{(n,m)}$ is hardly problematic.

However, such frequent rewriting is not generally needed in the case of displaying a still image. A driver needs to be driven to inject charges to a display element every time an image is rewritten, which consumes power. A method in which the frequency of rewriting is reduced as much as possible to reduce power consumption is disclosed in Patent Document 2.

A problem in a conventional active matrix liquid crystal display device including a silicon-based transistor (an amorphous silicon TFT or a polysilicon TFT) was the resistance $R_3$ in the equivalent circuit illustrated in FIG. 2B. The resistance $R_3$ which is resistance of the transistor in an off state (i.e., off-state resistance) was lower than the resistance $R_1$ and the resistance $R_2$ by several orders or more of magnitude.

Thus, charges in a liquid crystal display element could not be held for a long time, and the rewriting frequency could only be reduced to once per several seconds at most for the following reason: if rewriting is not performed for a long time, display is greatly deteriorated.

In recent years, research on a transistor using an oxide semiconductor has been advanced. In such a situation, it was found that off-state current in the transistor using an oxide semiconductor can be reduced to be lower than that in a silicon-based transistor by several orders or more of magnitude. Accordingly, the rewriting frequency can be further reduced; thus, a still-image display method in which rewriting is performed at extremely low frequency, for example, once per 100 seconds is considered possible.

[Patent Document 1] U.S. Pat. No. 7,362,304
[Patent Document 2] U.S. Pat. No. 7,321,353

SUMMARY OF THE INVENTION

However, in the case where the cycle of rewriting is longer than or equal to one second, a difference in image data between before and after rewriting is recognized even if the difference is small (e.g., a difference of 1 grayscale in 64 grayscales), which brings discomfort to users. In order to prevent such a problem, variation in charge (or variation in potential) of a liquid crystal display element needs to be less than or equal to 1% between frames (a period between rewriting and the subsequent rewriting).

In that case, the minimum values of the resistance $R_1$, the resistance $R_2$, and the resistance $R_3$ need to be increased, or the sum of the capacitance of the capacitor $C_{(n,m)}$ and the capacitance of the liquid crystal display element $LC_{(n,m)}$ needs to be increased.

Off-state current of a transistor using an oxide semiconductor can be extremely small, for example, 1 zA (zeptoampere, $10^{-21}$ A) (in terms of resistivity, $10^{20}$ Ω to $10^{21}$ Ω which is also extremely high); thus, the resistance $R_3$ is substantially infinite. In addition, since a dielectric with high insulating properties can be used as the capacitor, the resistance $R_1$ is also high. However, it was difficult to increase the resistance $R_2$ of the liquid crystal display element to $10^{13}$ Ω or higher for the following reasons: the resistivity of a liquid crystal material itself cannot be unlimitedly increased and the electrode area is large.

The area of the capacitor needs to be increased in order to increase the capacitance; however, increasing the area of the capacitor is restricted by the size of a pixel. In addition, when the capacitance is large, the amount of charge injected and emitted at the time of rewriting is also large, which increases power consumption.

An object of one embodiment of the present invention is to provide an electro-optical display device in which variation in charge of a liquid crystal display element can be suppressed to such a level that rewriting cannot be recognized by the human eye even in the case of performing rewriting at extremely low frequency, once in 100 seconds or less, or a display method of the electro-optical display device.

Another object of one embodiment of the present invention is to provide an electro-optical display device in which variation in charge (or variation in potential) of a display element in the longest frame is less than or equal to 1% or a display method of the electro-optical display device.

Another object of one embodiment of the present invention is to provide an electro-optical display device whose power consumption can be reduced or a display method of the electro-optical display device.

Another object of one embodiment of the present invention is to provide an electro-optical display device which has excellent display performance or a display method of the electro-optical display device.

Another object of one embodiment of the present invention is to provide an electro-optical display device which can display a still image with the number of times of rewriting reduced in order to reduce power consumption or a display method of the electro-optical display device.

Another object of one embodiment of the present invention is to provide a novel electro-optical display device which can display a still image and a moving image or a display method of the electro-optical display device.

Before the present invention is described, terms used in this specification will be briefly explained. A source and a drain of a transistor have the same or substantially the same structure and function. Even if the structures are different, in this specification, when one of a source and a drain of a transistor is called a source, the other is called a drain for convenience, and they are not particularly distinguished for the reason that a potential applied to the source or the drain or a polarity of the potential is not definite. Therefore, a source in this specification can be alternatively referred to as a drain.

In this specification, the expression "to be orthogonal to each other (in a matrix)" means not only to intersect with each other at right angles but also to be orthogonal to each other in the simplest circuit diagram even though a physical angle is not a right angle. In addition, the expression "to be parallel to each other (in a matrix)" means to be parallel to each other in the simplest circuit diagram even though two wirings are provided so as to physically intersect with each other.

Further, even when the expression "to be connected" is used in this specification, there is a case in which no physical connection is made in an actual circuit and a wiring is just extended. For example, in an insulated-gate field-effect transistor (MISFET) circuit, there is a case in which one wiring serves as gates of a plurality of MISFETs. In that case, one wiring may have a plurality of branches to gates in a circuit diagram. In this specification, the expression "a wiring is connected to a gate" is also used to describe such a case.

One embodiment of the present invention is an electro-optical display device having a pixel including a first transistor, a second transistor, a third transistor, and a display element. A source of the first transistor is connected to a gate of the second transistor and a gate of the third transistor, a source of the second transistor and a source of the third transistor are connected to one electrode of the display element, a gate of the first transistor is connected to a scan line, and a drain of the first transistor is connected to a signal line.

Here, the second transistor is an N-channel transistor and the third transistor is a P-channel transistor. Off-state current of the first transistor is preferably less than or equal to 1/100 of the leakage current of the display element.

The electro-optical display device may include a capacitor. The capacitor is arranged so that one electrode of the capacitor is connected to the source of the first transistor and the other electrode is connected to a capacitor line or another wiring. The capacitance of the capacitor is preferably less than or equal to 1/10 of the capacitance of the display element.

Another embodiment of the present invention is a display method of the above electro-optical display device having a frame which is longer than or equal to 100 seconds, preferably longer than or equal to 1000 seconds. Needless to say, the display method may be a method in which one or more frames each of which is shorter than 100 seconds and one or more frames each of which is longer than or equal to 100 seconds, preferably longer than or equal to 1000 seconds are combined.

For example, in successive first to third frames, the first frame, the second frame, and the third frame can be set to 16.7 milliseconds, 16.7 milliseconds, and 1000 seconds, respectively. Here, in the first frame, so-called overdriving in which an absolute value of potential applied to a display element is set to be larger than that of potential corresponding to a certain grayscale to increase the response speed of the display element may be performed; in the second frame, an absolute value of potential applied to the display element may be set to be slightly smaller than that of the potential corresponding to the grayscale; and then in the third frame which is long, the potential corresponding to the grayscale may be applied to the display element.

Another embodiment of the present invention is a display method of the above electro-optical display device which has a frame in which time taken for writing of one screen is shorter than or equal to 0.2 milliseconds.

In the above electro-optical display device, a drain of the second transistor may be connected to a high potential line. Alternatively, the drain of the second transistor and the other electrode of the capacitor may be connected to the capacitor line.

In the above electro-optical display device, a drain of the third transistor may be connected to a low potential line. Alternatively, the drain of the third transistor may be connected to the scan line.

The maximum value of the potential of the high potential line is preferably higher than or equal to the maximum value of potential applied to the one electrode of the display element, and the minimum value of the potential of the low potential line is preferably lower than or equal to the minimum value of the potential applied to the one electrode of the display element.

In the above electro-optical display device, an oxide semiconductor may be used in any one or two of the first to third transistors. For example, an oxide semiconductor may be used in the first transistor and the second transistor.

Alternatively, a polycrystalline semiconductor or a single crystal semiconductor may be used in one or both of the second transistor and the third transistor. As examples of the polycrystalline semiconductor, polycrystalline silicon, polycrystalline silicon germanium, and polycrystalline germanium are given. As examples of the single crystal semiconductor, single crystal silicon, single crystal silicon germanium, and single crystal germanium are given.

In particular, in the case where the gate capacitance of each of the second transistor and the third transistor is reduced, the second transistor and the third transistor are preferably formed using a semiconductor material whose field effect mobility is 10 times or more as high as that of the first transistor, or a semiconductor material whose field effect mobility is higher than or equal to 100 cm$^2$/Vs. The use of such a material makes it possible to secure sufficient on-state current even when a channel width is reduced; thus, the area of a channel can be reduced and the gate capacitance can be reduced.

In the case where the second transistor and the third transistor are formed using the above-described material with high field effect mobility, a driver circuit (a shift register or the like) located in the periphery of the display device may include a transistor using such a material.

In the above electro-optical display device, when the first transistor is in an off state (in the case of an N-channel transistor, a state where the potential of the gate is lower than the potential of the source and the potential of the drain), leakage current between the source and the drain is less than or equal to $1\times10^{-20}$ A, preferably less than or equal to $1\times10^{-21}$ A at a temperature where the transistor is in use (e.g., 25° C.), or less than or equal to $1\times10^{-20}$ A at 85° C.

In the case of a general silicon semiconductor, it is difficult to realize leakage current having such a small value; however, in a transistor obtained by processing an oxide semiconductor under preferable conditions, such a value can be achieved. Thus, an oxide semiconductor is preferably used as a material of the first transistor. Needless to say, if leakage current can be made to have a value smaller than or equal to the above-described value by another method with the use of a silicon semiconductor or other kinds of semiconductors, the use of such semiconductors is not precluded.

Although a variety of known materials can be used as an oxide semiconductor, the band gap of the material is preferably greater than or equal to 3 eV, more preferably greater than or equal to 3 eV and less than 3.6 eV. In addition, the electron affinity of the material is preferably greater than or equal to 4 eV, more preferably greater than or equal to 4 eV and less than 4.9 eV. In particular, an oxide including gallium and indium is preferable for the purpose of the present invention. Among these materials, a material whose carrier concentration derived from a donor or an acceptor is less than $1\times10^{-14}$ cm$^{-3}$, preferably less than $1\times10^{-11}$ cm$^{-3}$.

Although there is no limitation on the leakage current between a source and a drain of the second transistor or the third transistor in an off state, leakage current is preferably smaller, in which case power consumption can be reduced. Further, in the first to third transistors, gate leakage current (leakage current between the gate and the source or between the gate and the drain) needs to be extremely low; also in the capacitor, internal leakage current (leakage current between the electrodes) needs to be low. Each leakage current is preferably less than or equal to $1\times10^{-20}$ A, more preferably less than or equal to $1\times10^{-21}$ A at a temperature where the transistor or the capacitor is in use (e.g., 25° C.).

FIG. 1A illustrates an example of a circuit of a pixel in the electro-optical display device of one embodiment of the present invention. This pixel includes a first transistor (also referred to as a selection transistor) $WTr_{(n,m)}$, a second transistor (also referred to as an N-channel driving transistor) $NTr_{(n,m)}$, a third transistor (also referred to as a P-channel driving transistor) $PTr_{(n,m)}$, a capacitor $C_{(n,m)}$, and a display element $LC_{(n,m)}$.

A source of the selection transistor $WTr_{(n,m)}$ is connected to a gate of the N-channel driving transistor $NTr_{(n,m)}$, a gate of the P-channel driving transistor $PTr_{(n,m)}$, and one electrode of the capacitor $C_{(n,m)}$. A source of the N-channel driving transistor $NTr_{(n,m)}$ and a source of the P-channel driving transistor $PTr_{(n,m)}$ are connected to one electrode of the display element $LC_{(n,m)}$.

A gate of the selection transistor $WTr_{(n,m)}$ is connected to a scan line $X_n$, a drain of the selection transistor $WTr_{(n,m)}$ is connected to a signal line $Y_m$, and the other electrode of the capacitor $C_{(n,m)}$ is connected to a capacitor line $Z_n$. Moreover, a drain of the N-channel driving transistor $NTr_{(n,m)}$ is connected to a high potential line $U_n$, and a drain of the P-channel driving transistor $PTr_{(n,m)}$ is connected to a low potential line $W_n$.

Although the N-channel driving transistor $NTr_{(n,m)}$ and the P-channel driving transistor $PTr_{(n,m)}$ have a similar structure to a CMOS inverter circuit, they have a different polarity of a power supply from the CMOS inverter circuit. An operation example of such a circuit will be described with reference to FIGS. 3A to 3F. In each of FIGS. 3A to 3F, a circle is drawn on a transistor in an on state and a cross mark is drawn on a transistor in an off state.

Note that specific numeric values of potentials are given below for understanding the technical idea of the present invention. Needless to say, such values are changed depending on a variety of characteristics of a transistor and a capacitor, or the convenience of a practitioner.

The high potential line $U_n$ is held at +5 V, and the low potential line $W_n$ is held at −5 V. A scan pulse and an image signal are supplied to the scan line $X_n$ and the signal line $Y_m$, respectively, as in a conventional active matrix liquid crystal display device. The capacitor line $Z_n$ is held at constant potential (e.g., 0 V).

Further, the N-channel driving transistor $NTr_{(n,m)}$ is off (current does not flow) when the potential of the gate is lower than the potential of the source or the potential of the drain, whichever is lower, and is on (current flows) when the potential of the gate is the same as or higher than the potential of the source or the potential of the drain, whichever is lower. Further, the P-channel driving transistor $PTr_{(n,m)}$ is off (current does not flow) when the potential of the gate is higher than the potential of the source or the potential of the drain, whichever is higher, and is on (current flows) when the potential of the gate is the same as or lower than the potential of the source or the potential of the drain, whichever is higher.

Such characteristics of the transistors are extremely ideal, that is, the threshold voltages of both the N-channel driving transistor $NTr_{(n,m)}$ and the P-channel driving transistor $PTr_{(n,m)}$ are 0 V. Here, such ideal transistors are assumed for simplicity of the description; however, it is actually necessary to consider that transistors operate in accordance with their threshold voltages.

In particular, in transistors using a material such as polycrystalline silicon, variation in threshold voltage is large between the transistors. When a display device is formed using such transistors with different qualities, display unevenness occurs. In order to solve such a problem, original display signals are preferably corrected so that display signals corresponding to respective transistors are input to the transistors.

Assume that the potential of the source of the N-channel driving transistor $NTr_{(n,m)}$ (i.e., the potential of the source of the P-channel driving transistor $PTr_{(n,m)}$ or the potential of the one electrode of the display element $LC_{(n,m)}$) is 0 V and that the potential of the other electrode of the display element $LC_{(n,m)}$ is also 0 V.

The case where data of +5 V is written to this pixel (i.e., the potential of the one electrode of the display element $LC_{(n,m)}$ is increased to +5 V) is considered. In that case, the potential of the gate of the N-channel driving transistor $NTr_{(n,m)}$ (i.e., the potential of the gate of the P-channel driving transistor $PTr_{(n,m)}$) is preferably set at +5 V. In other words, as in the case of normal data writing of an active matrix liquid crystal display device, the potential of the scan line $X_n$ may be controlled to turn on the selection transistor $WTr_{(n,m)}$, the potential of the signal line $Y_m$ may be set at +5 V, and furthermore the potential of the scan line $X_n$ may be controlled to turn off the selection transistor $WTr_{(n,m)}$.

The potential of the source of the selection transistor $WTr_{(n,m)}$ (i.e., the gate of the N-channel driving transistor $NTr_{(n,m)}$ and the gate of the P-channel driving transistor $PTr_{(n,m)}$) becomes +5 V, so that the N-channel driving transistor $NTr_{(n,m)}$ is turned on and current flows from the high potential line $U_n$ to the source of the N-channel driving transistor $NTr_{(n,m)}$. In contrast, the P-channel driving transistor $PTr_{(n,m)}$ is off. Thus, the one electrode of the display element $LC_{(n,m)}$ is increased from 0 V to +5 V as illustrated in FIG. 3A.

Next, the case where data of −3 V is written to the pixel is considered. In that case, the potential of the gate of the N-channel driving transistor $NTr_{(n,m)}$ (i.e., the potential of the gate of the P-channel driving transistor $PTr_{(n,m)}$) is preferably set at −3 V.

The potential of the gate of the P-channel driving transistor $PTr_{(n,m)}$ becomes −3 V, so that the P-channel driving transistor $PTr_{(n,m)}$ is turned on and current flows from the source of the P-channel driving transistor $PTr_{(n,m)}$ to the low potential line $W_n$. In contrast, the N-channel driving transistor $NTr_{(n,m)}$ is off. Thus, the potential of the one electrode of the display element $LC_{(n,m)}$ is decreased from +5 V to −3 V as illustrated in FIG. 3B.

Next, the case where data of +2 V is written to the pixel is considered. In that case, the potential of the gate of the N-channel driving transistor $NTr_{(n,m)}$ (i.e., the potential of the gate of the P-channel driving transistor $PTr_{(n,m)}$) is preferably set at +2 V.

The potential of the gate of the N-channel driving transistor $NTr_{(n,m)}$ becomes +2 V, so that the N-channel driving transistor $NTr_{(n,m)}$ is turned on and current flows from the high potential line $U_n$ to the source of the N-channel driving transistor $NTr_{(n,m)}$. In contrast, the P-channel driving transistor $PTr_{(n,m)}$ is off. Thus, the potential of the one electrode of the display element $LC_{(n,m)}$ is increased from −3 V to +2 V as illustrated in FIG. 3C.

Next, the case where data of −5 V is written to the pixel is considered. In that case, the potential of the gate of the N-channel driving transistor $NTr_{(n,m)}$ (i.e., the potential of the gate of the P-channel driving transistor $PTr_{(n,m)}$ is preferably set at −5 V.

The potential of the gate of the P-channel driving transistor $PTr_{(n,m)}$ becomes −5 V, so that the P-channel driving transistor $PTr_{(n,m)}$ is turned on and current flows from the source of the P-channel driving transistor $PTr_{(n,m)}$ to the low potential line $W_n$. In contrast, the N-channel driving transistor $NTr_{(n,m)}$ is off. Thus, the potential of the one electrode of the display element $LC_{(n,m)}$ is decreased from +2 V to −5 V as illustrated in FIG. 3D.

Described above is AC driving in which the polarity of the potential of the pixel is inverted every time data rewriting is performed; however, the potential can be changed with the polarity kept the same. Next, the case where data of −3 V is written to the pixel in the state of FIG. 3D is considered. In that case, the potential of the gate of the N-channel driving transistor $NTr_{(n,m)}$ (i.e., the potential of the gate of the P-channel driving transistor $PTr_{(n,m)}$) is preferably set at −3 V.

The potential of the gate of the N-channel driving transistor $NTr_{(n,m)}$ becomes −3 V, so that the N-channel driving transistor $NTr_{(n,m)}$ is turned on and current flows from the high potential line $U_n$ to the source of the N-channel driving transistor $NTr_{(n,m)}$. In contrast, the P-channel driving transistor $PTr_{(n,m)}$ is off. Thus, the potential of the one electrode of the display element $LC_{(n,m)}$ is increased from −5 V to −3 V as illustrated in FIG. 3E.

Next, the case where data of −4 V is written to the pixel is considered. In that case, the potential of the gate of the N-channel driving transistor $NTr_{(n,m)}$ (i.e., the potential of the gate of the P-channel driving transistor $PTr_{(n,m)}$ is preferably set at −4 V.

The potential of the gate of the P-channel driving transistor $PTr_{(n,m)}$ becomes −4 V, so that the P-channel driving transistor $PTr_{(n,m)}$ is turned on and current flows from the source of the P-channel driving transistor $PTr_{(n,m)}$ to the low potential line $W_n$. In contrast, the N-channel driving transistor $NTr_{(n,m)}$ is off. Thus, the potential of the one electrode of the display element $LC_{(n,m)}$ is decreased from −3 V to −4 V as illustrated in FIG. 3F.

In such a manner, the potential of the display element $LC_{(n,m)}$ is controlled, whereby image display can be performed with the use of analog signals. By applying the above-described method, display can be performed with one frame of 16.7 milliseconds, which is substantially the same as in a normal liquid crystal display device. When one frame is set longer than or equal to 100 seconds, preferably longer than or equal to 1000 seconds, power consumption in still-image display can be reduced.

Here, it is important to stabilize the potential of the gate of the N-channel driving transistor $NTr_{(n,m)}$ (i.e., the potential of the gate of the P-channel driving transistor $PTr_{(n,m)}$) in order to reduce variation in the potential of the one electrode of the display element $LC_{(n,m)}$ for the following reason: potential corresponding to the potential of the gate of the N-channel driving transistor $NTr_{(n,m)}$ (i.e., the potential of the gate of the P-channel driving transistor $PTr_{(n,m)}$) is applied to the one electrode of the display element $LC_{(n,m)}$.

Although the resistance of the display element $LC_{(n,m)}$ is preferably high, the resistance is finite, which causes moderate leakage current. For example, in FIG. 3F, the potential of the one electrode of the display element $LC_{(n,m)}$ is −4 V. If there are no factors, the potential of the one electrode of the display element $LC_{(n,m)}$ moves to 0 V as close as possible. In the circuit illustrated in FIG. 1A, when the potential of the one electrode of the display element $LC_{(n,m)}$ moves to be larger than −4 V even slightly, charges immediately transfer through the P-channel driving transistor $PTr_{(n,m)}$ in an on state, so that the potential automatically goes back to −4 V.

The above effect allows display to be maintained for a long time without deterioration. Needless to say, although high resistance of the display element $LC_{(n,m)}$ in the circuit illustrated in FIG. 1A is effective in reducing power consumption, display deterioration does not occur even if the resistance is not quite high.

On the other hand, the variation in the potential of the gate of the N-channel driving transistor $NTr_{(n,m)}$ (i.e., the potential of the gate of the P-channel driving transistor $PTr_{(n,m)}$) needs to be avoided as much as possible for the following reason: the potential of the one electrode of the display element $LC_{(n,m)}$ is automatically determined in accordance with the potential of the gate of the N-channel driving transistor $NTr_{(n,m)}$ (i.e., the potential of the gate of the P-channel driving transistor $PTr_{(n,m)}$) as described above.

Here, when the off-state resistance of the selection transistor $WTr_{(n,m)}$ is sufficiently high, the variation in the potential of the gate of the N-channel driving transistor $NTr_{(n,m)}$ (i.e., the potential of the gate of the P-channel driving transistor $PTr_{(n,m)}$) is extremely small. For example, in the case where the sum of capacitance of the capacitor $C_{(n,m)}$ and parasitic capacitance of other parts is set to 100 fF which is 1/20 of the capacitance of a typical liquid crystal display element and the sum of resistance of off-state resistance of the selection transistor $WTr_{(n,m)}$, parasitic resistance of the capacitor $C_{(n,m)}$, parasitic resistance between the gate and the source of the N-channel driving transistor $NTr_{(n,m)}$, and parasitic resistance between the gate and the source of the P-channel driving transistor $PTr_{(n,m)}$ is set to $10^{20}$ Ω, the time constant of a circuit formed using the capacitance of the capacitor $C_{(n,m)}$ and the like and the above resistance is $10^7$ seconds.

This means that the variation in the potential at the point where 100 seconds have passed is 0.001%, and the variation in the potential is 0.01% even at the point where 1000 seconds have passed. Thus, even if one frame is longer than or equal to 100 seconds, preferably longer than or equal to 1000 seconds, variation in the potential of the display element can be less than or equal to 1%, and a difference in display between before and after rewriting even having such a long period cannot be recognized.

Needless to say, an increase in the capacitance of the capacitor $C_{(n,m)}$ allows the variation in the potential to be suppressed for a longer time. However, the increase in the capacitance of the capacitor $C_{(n,m)}$ causes an increase in power consumption during rewriting. Further, increasing the area of the capacitor $C_{(n,m)}$ or reducing the distance between electrodes in order to increase the capacitance is not preferable because leakage current is increased.

Further, large capacitance impairs rewriting at an extremely high speed, which is described later, in some cases.

Thus, the capacitance is preferably greater than or equal to 1 fF and less than 1 pF, more preferably greater than or equal to 5 fF and less than 200 fF. Such capacitance does not impair the implementation of the present invention at all due to the characteristic of the circuit.

Note that the capacitance here includes, in its category, the gate capacitance of the N-channel driving transistor $NTr_{(n,m)}$, the gate capacitance of the P-channel driving transistor $PTr_{(n,m)}$, and the like. Thus, the capacitor $C_{(n,m)}$ does not particularly need to be provided as long as such capacitance has a certain amount. In the case where the capacitor $C_{(n,m)}$ is not provided, a capacitor line needed for the capacitor $C_{(n,m)}$ can be omitted.

Note that by making the capacitance of the capacitor $C_{(n,m)}$ and the like sufficiently small as described above, driving can also be performed at a high speed. Thus, writing is performed for a short time in one frame and a driver circuit needed for writing is stopped during the most of the time in the one frame, whereby power consumption can be reduced. In addition, image display, in particular, display of a moving image at a high speed can be improved.

In a normal active matrix liquid crystal display device, most of the time in one frame is spent for writing of one screen. In the case where one frame is, for example, 16.7 milliseconds, writing (rewriting) to any of rows is performed during most of the time in the frame. In such a situation, power is constantly supplied to the driver circuit.

In a driver, a CMOS inverter circuit or the like is usually used. Since power supply voltage is supplied to the driver, through current is generated in an inverter; thus, power is consumed.

In order to reduce the power consumption, the driver is stopped as much as possible in one frame to stop power supply to the driver. For that purpose, time necessary for writing (rewriting) of one screen is preferably reduced. In other words, the time necessary for writing may be set to be shorter than 2 milliseconds or less than 10% of one frame, whichever is shorter, and if possible, shorter than 0.2 milliseconds or less than 1% of one frame, whichever is shorter. The driver circuit may be stopped in the rest of the time.

Note that not all driver circuits need to be stopped here, and at least a circuit which supplies a signal to the scan line or the signal line may be stopped during the above-described period. Needless to say, when a larger number of circuits are stopped, power consumption can be reduced more.

Under the above condition, in the case where one frame is, for example, 16.7 milliseconds, a display signal is not supplied to the signal line in 90% or more of the frame, and time for image writing (rewriting) is less than 10% of the frame, that is, shorter than 1.67 milliseconds, preferably shorter than 0.17 milliseconds.

Further, in the case where one frame is 33.3 milliseconds, a display signal is not supplied to the signal line for longer than or equal to 31.3 milliseconds, and the time for which a display signal is applied to the signal line is shorter than 2 milliseconds, preferably shorter than 0.2 milliseconds.

For example, in the case where a potential difference between the source and the drain and a potential difference between the gate and the source are set to +5 V and +10 V, respectively in the selection transistor $WTr_{(n,m)}$ which has a field effect mobility of 11 cm$^2$/Vs, a channel length of 2 μm, a channel width of 20 μm, a thickness of a gate insulating film (silicon oxide) of 30 nm, and a threshold voltage of 0 V, current between the source and the drain and on-state resistivity are calculated to be approximately 0.5 mA and 10 kΩ, respectively.

In addition, the time constant in the case where the capacitance (including parasitic capacitance) of the capacitor $C_{(n,m)}$ and the like is 100 fF is 1 nanosecond (100 fF×10 kΩ), and 100 nanoseconds is sufficient for data writing. If the number of rows in a matrix of the display device is 1000, the time necessary for rewriting of one screen is 0.1 millisecond, which is 1000 times as long as 100 nanoseconds, and the above condition is satisfied.

In order to achieve such a high-speed operation, the capacitance of the capacitor $C_{(n,m)}$ is preferably less than 200 fF. The capacitance of the capacitor $C_{(n,m)}$ is a factor in determining time for which the potential of the gate of the N-channel driving transistor $NTr_{(n,m)}$ is held, and can be determined independently of the capacitance of the liquid crystal display element $LC_{(n,m)}$.

Thus, if the time for which the potential of the gate of the N-channel driving transistor $NTr_{(n,m)}$ is held is enough, the capacitance of the capacitor $C_{(n,m)}$ is preferably reduced as much as possible. In this regard, the electro-optical display device of the present invention is different from a conventional active matrix display device in which the capacitance of a capacitor is determined depending on the capacitance of a liquid crystal display element.

Note that according to the characteristics of the circuit illustrated in FIG. 1A, the gate capacitance of the N-channel driving transistor $NTr_{(n,m)}$ and the gate capacitance of the P-channel driving transistor $PTr_{(n,m)}$ are also parasitic capacitance parallel to the capacitance of the capacitor $C_{(n,m)}$. It is effective to reduce the channel areas of the N-channel driving transistor $NTr_{(n,m)}$ and the P-channel driving transistor $PTr_{(n,m)}$ in order to reduce such parasitic capacitance.

For that purpose, it is preferable that polycrystalline silicon or single crystal silicon with high field effect mobility be used for the N-channel driving transistor $NTr_{(n,m)}$ and the P-channel driving transistor $PTr_{(n,m)}$ and that the channel width of each of the transistor be set to 1/50 to 1/5 of the channel width of the selection transistor $WTr_{(n,m)}$. Even when the channel width is set to, for example, 1/10 of the channel width of the selection transistor $WTr_{(n,m)}$, the operation of the display device has little problem.

Note that, although one frame is set to 16.7 milliseconds or 33.3 milliseconds in the above example, an effect of a reduction in power consumption can be obtained by stopping at least part of a driver circuit even in the case where a still image is displayed with one frame of 100 seconds or 1000 seconds.

Some examples are described above as embodiments of the present invention. However, it is obvious, from the technical idea of the present invention, that other modes which can achieve at least one of the objects are also possible without limitation to the above examples.

As is clear from the above description, even when rewriting is performed every 100 seconds or longer, variation in potential of a display element can be as small as 1% or less. As a result, deterioration of display can be reduced to such a level that a difference in display between before and after rewriting cannot be recognized.

Further, the method described above, in which rewriting of one screen is performed by spending extremely short time of 0.2 milliseconds or shorter in one frame, for example, 0.17 milliseconds in the frame and the image is held during the rest of the frame, is similar to the method for images on a film.

It is preferable that such characteristics be applied to a three-dimensional (3D) image display method of a frame sequential type, in which high-speed shutters are used. In such a 3D image display method, an image for the left eye and an image for the right eye are switched at a high speed, and right-and-left shutters of a pair of 3D glasses are switched corresponding to the images. For example, when people see an image for the right eye, the shutter for the right eye opens so people can see the image. The image is preferably completed substantially at this point.

A commercially available liquid crystal display device of a frame sequential type employs 240 Hz driving. The mechanism of the 240 Hz driving is as follows: an image for the left eye is completed in 1/240 seconds, a shutter for the left eye opens for the subsequent 1/240 seconds, an image for the right eye is completed in the subsequent 1/240 seconds, and a shutter for the right eye opens for the subsequent 1/240 seconds. In other words, the period in which the left eye sees the image is 1/4 of the total, which causes people to see darkness in the image. Thus, a screen needs to be brightened than usual; however, needless to say, this causes an increase in power consumption.

This problem can be solved by increasing the time for which the shutter opens. The above-described characteristic in which image rewriting can be performed by spending 10% or less of one frame, or shorter than or equal to 2 milliseconds is suitable for the purpose.

Furthermore, in a liquid crystal display device which needs to perform image writing at such a high speed, a liquid crystal exhibiting a blue phase as a liquid crystal phase is preferably used. However, the blue-phase liquid crystal has a problem in that the resistance is lower than that of general liquid crystal materials.

Due to the above problem, once still image display is performed with one frame of several seconds or longer by the method disclosed in Patent Document 2, display is deteriorated even though moving image display is performed without any problem. In contrast, when one embodiment of the present invention is applied to a blue-phase liquid crystal, display deterioration due to leakage current by the blue-phase liquid crystal can be sufficiently suppressed.

In other words, when one of the embodiments of the present invention is applied to the blue phase liquid crystal, excellent moving image display (including 3D image display of a frame sequential type) can be performed. In addition, a liquid crystal display device in which power consumption in still-image display is low can be obtained.

DETAILED DESCRIPTION OF THE INVENTION

Figure 1A:
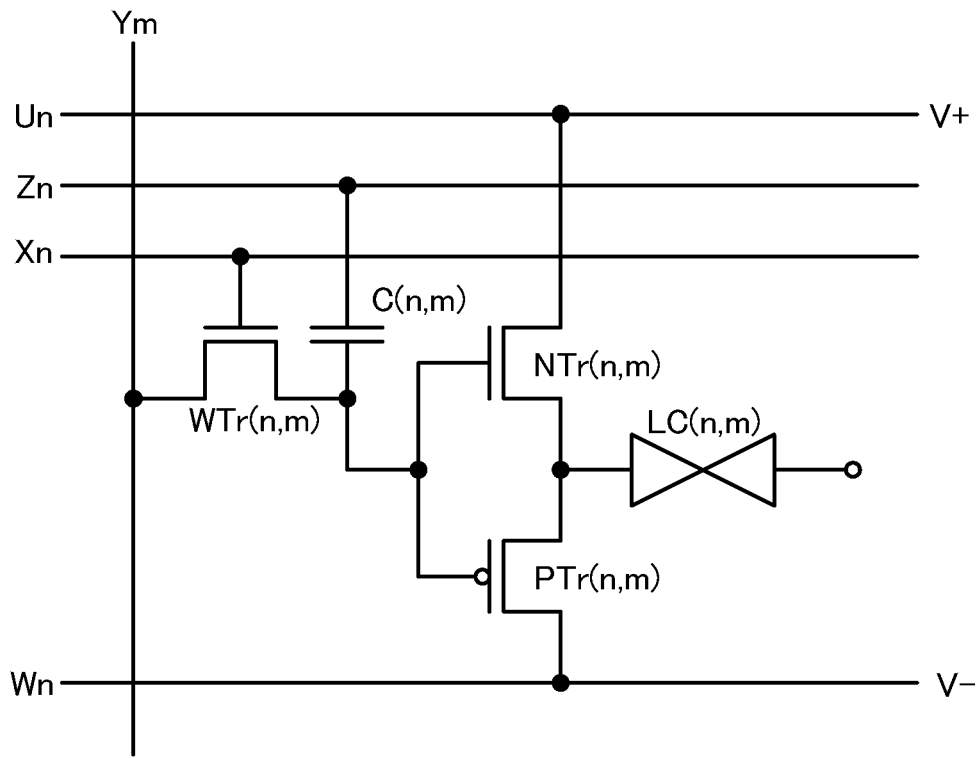
FIGS. 1A and 1B illustrate examples of circuits of an electro-optical display device of the present invention.

Hereinafter, the Embodiments will be described with reference to the accompanying drawings. Note that the Embodiments can be carried out in many different modes, and it is easily understood by those skilled in the art that modes and details can be modified in various ways without departing from the spirit and scope of the present invention. Therefore, the present invention should not be construed as being limited to the description of the embodiments below.

The structures, the conditions, and the like disclosed in any of the following Embodiments can be combined with each other as appropriate. Note that in structures described below, the same portions or portions having similar functions are denoted by the same reference numerals in different drawings, and detailed description thereof is not repeated in some cases.

Note that in this specification, in referring to a specific row, column, or position in a matrix, reference signs with coordinates such as a "selection transistor $WTr_{(n,m)}$" and a "scan line $X_m$" are used. In particular, in the case where a row, a column, or a position is not specified or the case where elements are collectively referred to, the following expressions may be used: a "selection transistor WTr" and a "scan line X", or simply a "selection transistor" and a "scan line".

Further, in FIGS. 1A and 1B, FIGS. 2A and 2B, FIGS. 3A to 3F, FIGS. 4A and 4B, FIGS. 5A and 5B, FIGS. 6A and 6B, FIGS. 7A and 7B, FIGS. 8A and 8B, FIGS. 9A and 9B, FIG. 10, and FIGS. 11A and 11B, unless otherwise specified, reference numerals $X_n$, $X_{n+1}$, $X_{2n}$, $X_{2n+1}$, $X_{2n+2}$ refer to scan lines; $Y_m$, a signal line; $Z_n$, $Z_{n+1}$, and $Z_m$, capacitor lines; $U_n$, $U_{n+1}$, and $U_m$, high potential lines; $W_n$, $W_{n+1}$, and $W_m$, low potential lines; $WTr_{(n,m)}$, a selection transistor; $NTr_{(n,m)}$, an N-channel driving transistor; $PTr_{(n,m)}$, a P-channel driving transistor; $C_{(n,m)}$, a capacitor; and $LC_{(n,m)}$, a display element.
(Embodiment 1)

In this embodiment, an electro-optical display device illustrated in FIG. 1B will be described. The electro-optical display device illustrated in FIG. 1B is obtained by modifying the electro-optical display device illustrated in FIG. 1A. The difference between FIG. 1A and FIG. 1B lies in that a capacitor line is orthogonal to a scan line (the capacitor line is parallel to a signal line) in FIG. 1B, while the capacitor line is parallel to the scan line in FIG. 1A.

With this structure, the signal line does not cross the capacitor line. Thus, parasitic capacitance caused by the crossing can be reduced and attenuation of a display signal can be suppressed.

The electro-optical display device of this embodiment can be driven by a method the same as that in FIGS. 3A to 3F.
(Embodiment 2)

Figure 4A:
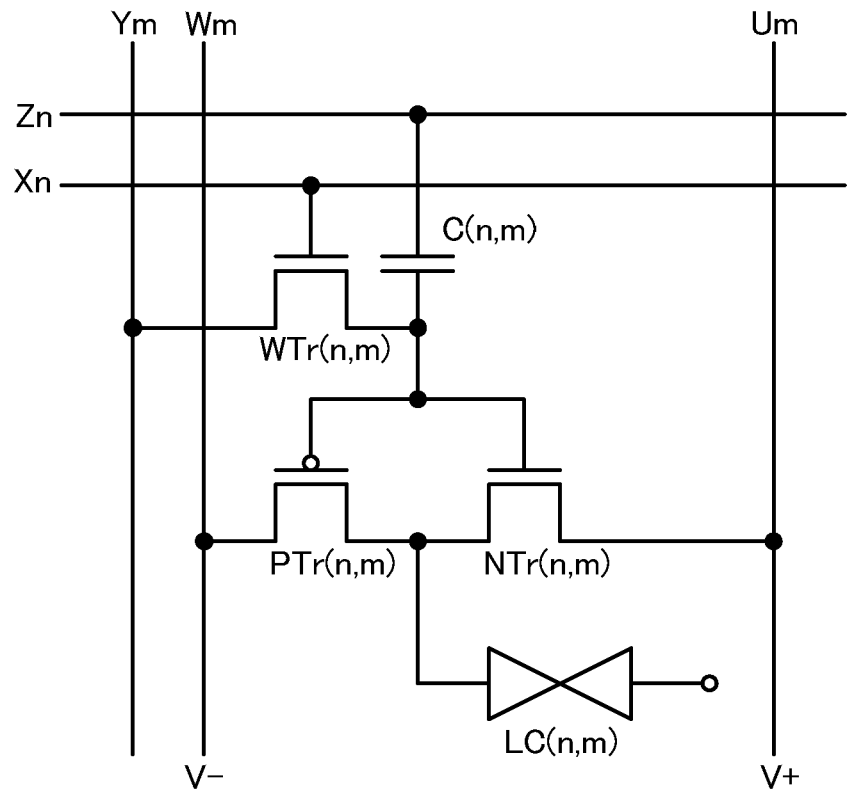
FIGS. 4A and 4B illustrate examples of circuits of an electro-optical display device of the present invention.
Figure 4B:
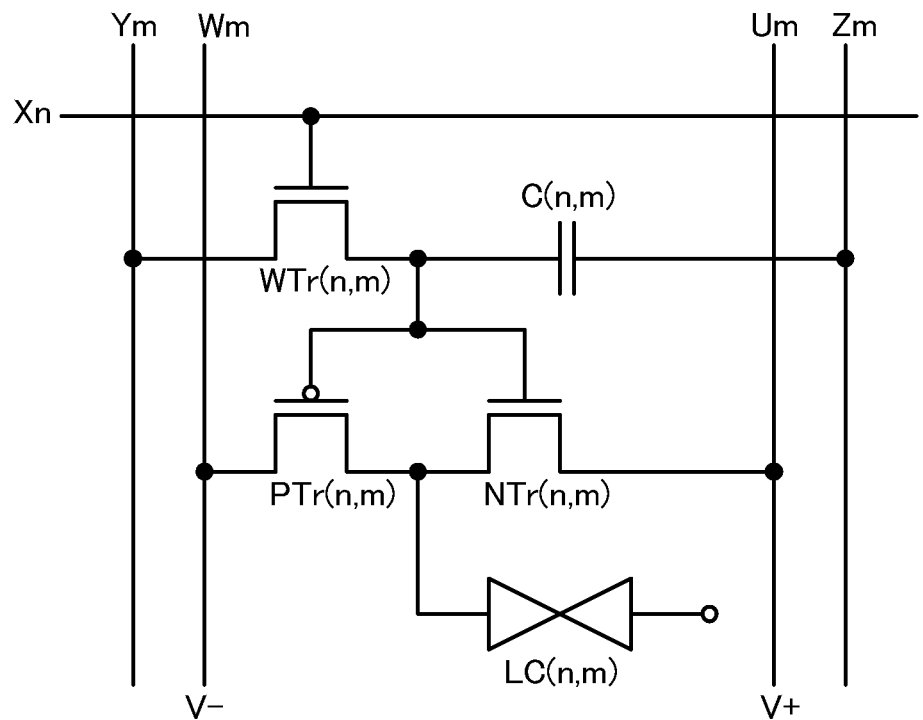

In this embodiment, electro-optical display devices illustrated in FIGS. 4A and 4B will be described. The electro-optical display device illustrated in FIG. 4A is obtained by modifying the electro-optical display device illustrated in FIG. 1A. The electro-optical display device illustrated in FIG. 4B is obtained by modifying the electro-optical display device illustrated in FIG. 1B. The difference between FIG. 1A and FIG. 4A (or the difference between FIG. 1B and FIG. 4B) lies in that a high potential line and a low potential line are orthogonal to a scan line (the high potential line and the low potential line are parallel to a signal line) in FIG. 4A (or FIG. 4B), while the high potential line and the low potential line are parallel to the scan line in FIG. 1A (or FIG. 1B).

With this structure, the signal line does not cross the high potential line and the low potential line. Thus, parasitic capacitance caused by the crossing can be reduced and attenuation of a display signal can be suppressed.

The electro-optical display device of this embodiment can be driven by a method the same as that in FIGS. 3A to 3F.

(Embodiment 3)

Figure 5A:
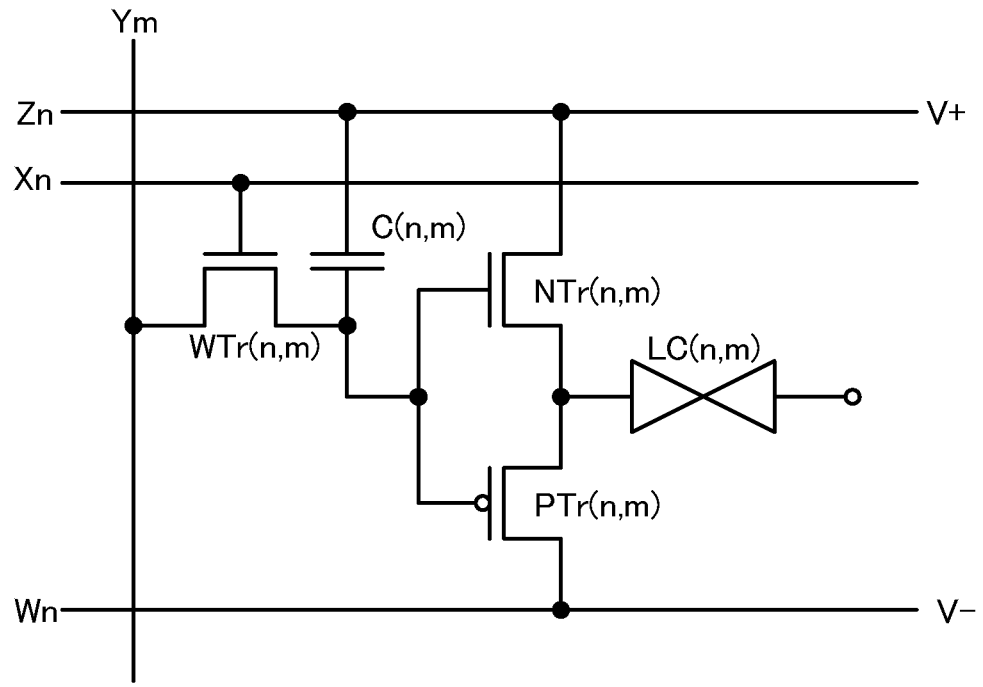
FIGS. 5A and 5B illustrate examples of circuits of an electro-optical display device of the present invention.
Figure 5B:
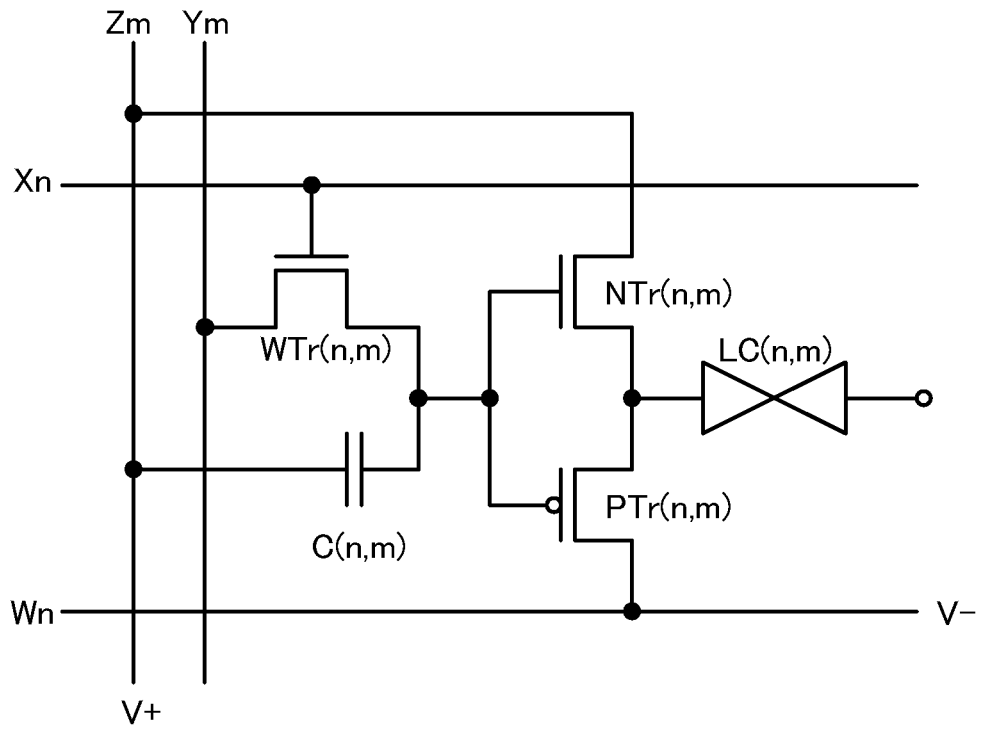
Figure 6A:
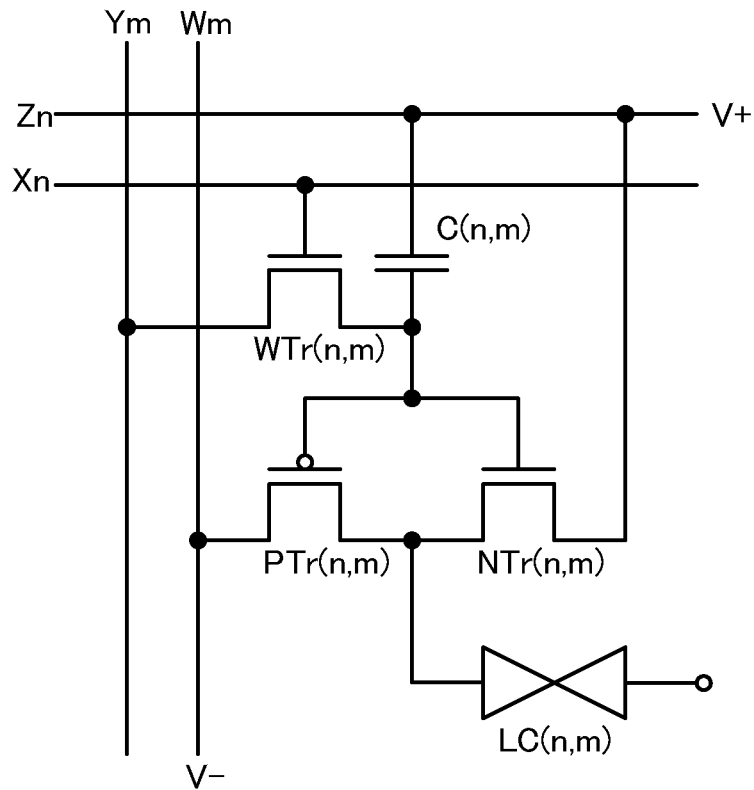
FIGS. 6A and 6B illustrate examples of circuits of an electro-optical display device of the present invention.
Figure 6B:
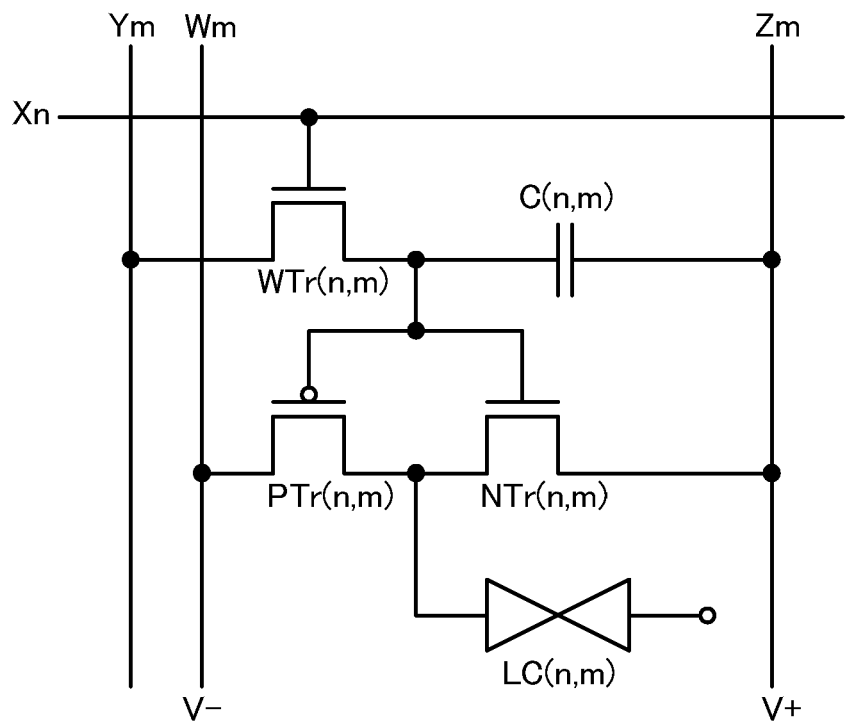

In this embodiment, electro-optical display devices illustrated in FIGS. 5A and 5B and FIGS. 6A and 6B will be described. The electro-optical display devices illustrated in FIGS. 5A and 5B are obtained by modifying the electro-optical display devices illustrated in FIGS. 1A and 1B, respectively. The electro-optical display devices illustrated in FIGS. 6A and 6B are obtained by modifying the electro-optical display devices illustrated in FIGS. 4A and 4B, respectively.

Figure 1B:
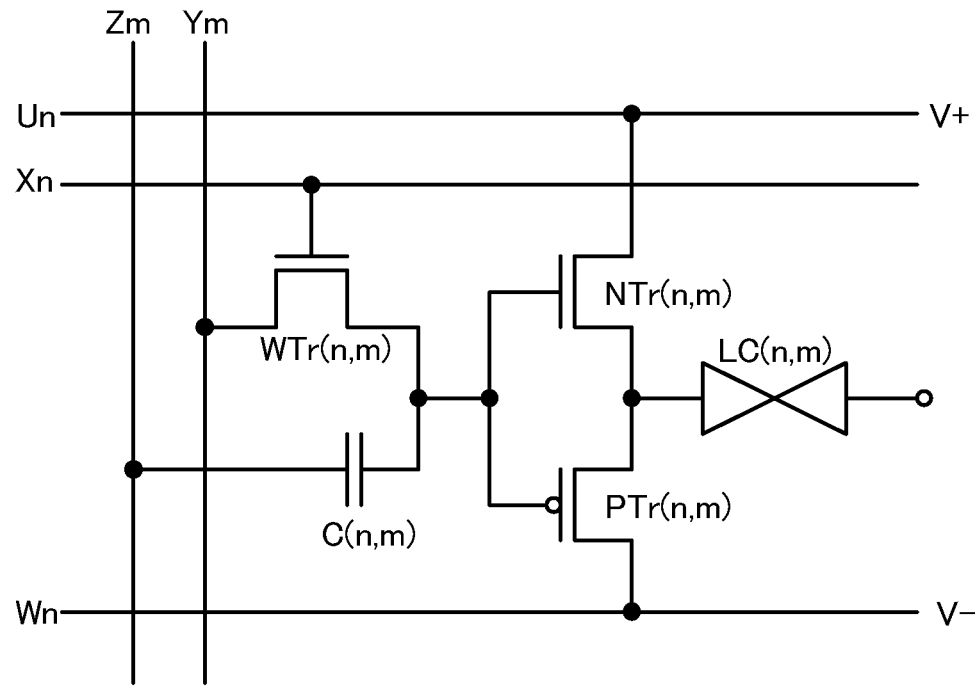
Figure 2A:
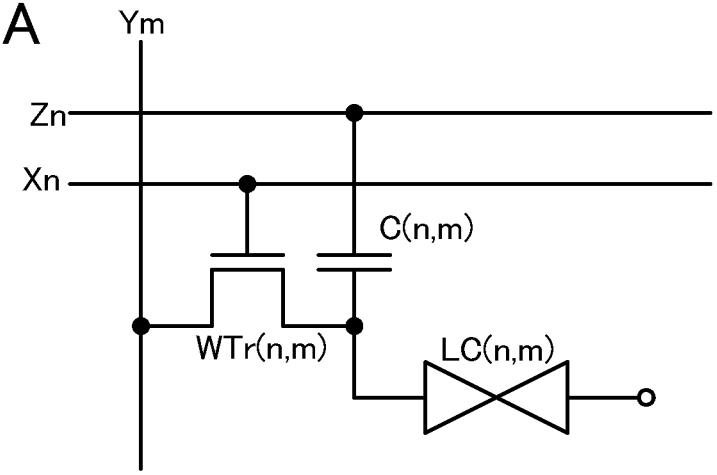
FIGS. 2A and 2B illustrate examples of circuits of a conventional electro-optical display device.
Figure 2B:
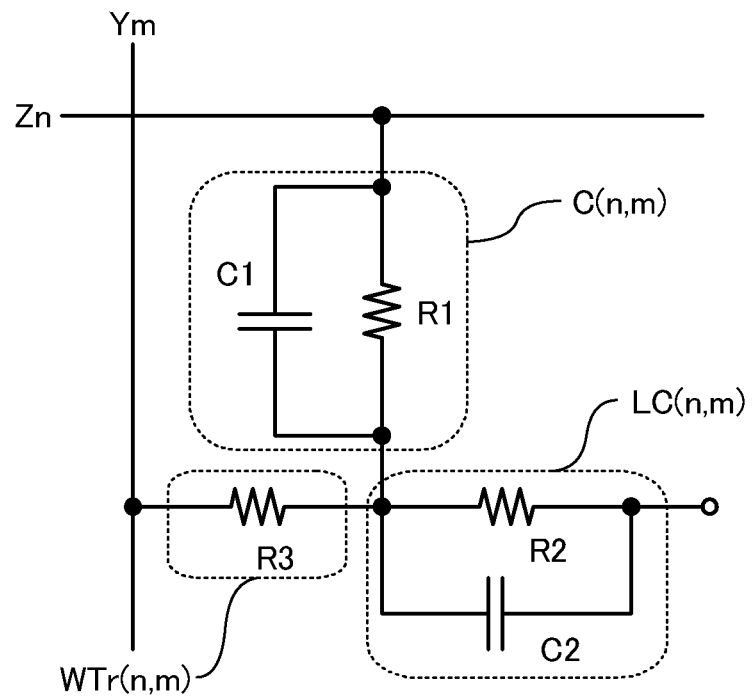
Figure 3A:
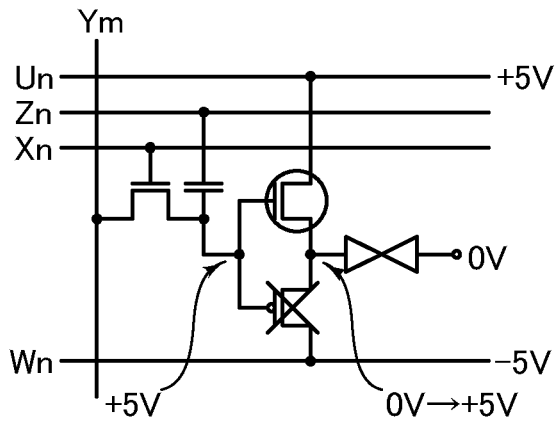
FIGS. 3A to 3F illustrate examples of driving methods of a circuit of an electro-optical display device of the present invention.
Figure 3B:
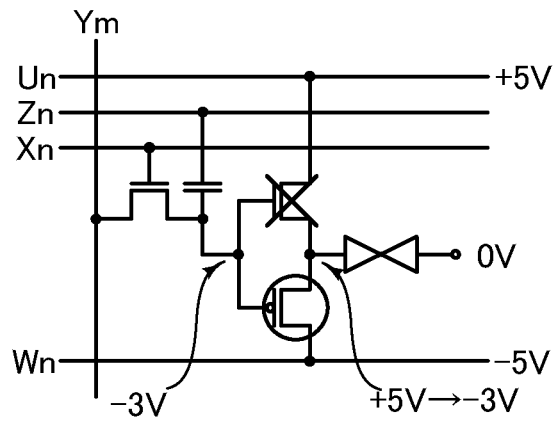
Figure 3C:
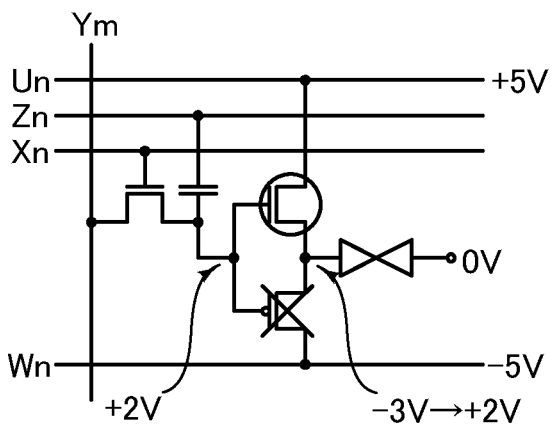
Figure 3D:
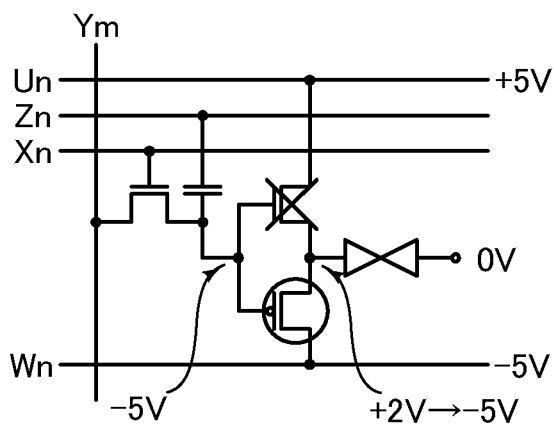
Figure 3E:
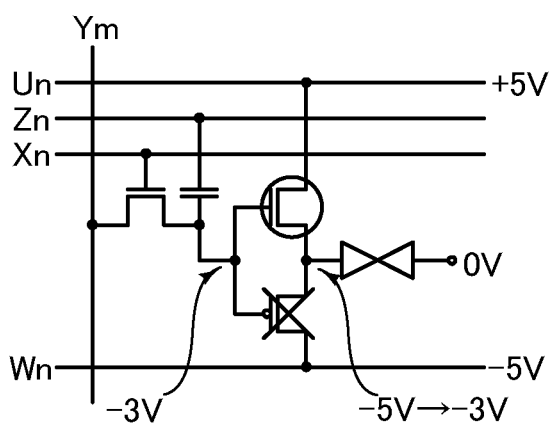
Figure 3F:
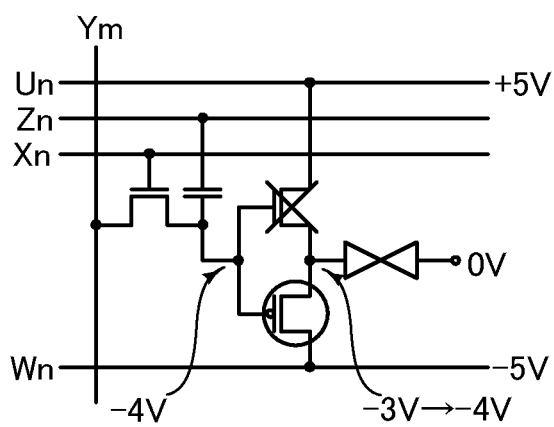

The difference between FIG. 1A and FIG. 5A (or between FIG. 1B and FIG. 5B, between FIG. 4A and FIG. 6A, and between FIG. 4B and FIG. 6B) lies in that a capacitor line is substituted for a high potential line in FIG. 5A (FIG. 5B, FIG. 6A, and FIG. 6B), while the high potential line is provided in FIG. 1A (FIG. 1B, FIG. 4A, and FIG. 4B).

With this structure, the number of total wirings can be reduced and an aperture ratio of a pixel can be increased. For example, in the case of a matrix having N rows and M columns (N and M are each a natural number greater than or equal to 2), the display devices having the circuit configurations of FIG. 5A and FIG. 5B have (3N+M) wirings and (2N+2M) wirings, respectively, while the display devices having the circuit configurations of FIG. 1A and FIG. 1B have (4N+M) wirings and (3N+2M) wirings, respectively. Thus, the number of wirings in FIG. 5A can be smaller by N than that in FIG. 1A; the number of wirings in FIG. 5B can be smaller by N than that in FIG. 1B.

Further, in FIG. 5A, the number of wirings crossed by a signal line can be reduced, which allows a reduction in parasitic capacitance and suppression of attenuation of a display signal.

Note that in this embodiment, it is preferable that the maximum value of the potential of the capacitor line be greater than or equal to the maximum value of the potential applied to one electrode of a display element. Other than that, the electro-optical display device of this embodiment can be driven by a method the same as that in FIGS. 3A to 3F.

(Embodiment 4)

In this embodiment, electro-optical display devices illustrated in FIGS. 7A and 7B will be described. The electro-optical display devices illustrated in FIGS. 7A and 7B are obtained by modifying the electro-optical display devices illustrated in FIG. 1A and FIG. 4A, respectively.

Figure 7A:
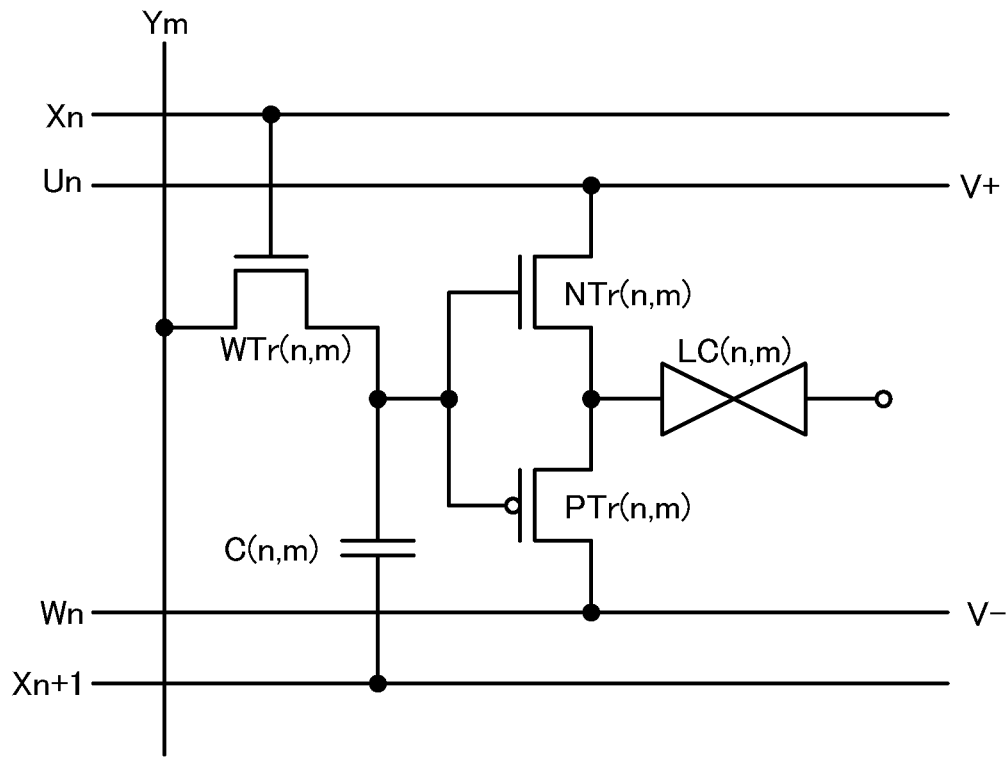
FIGS. 7A and 7B illustrate examples of circuits of an electro-optical display device of the present invention.
Figure 7B:
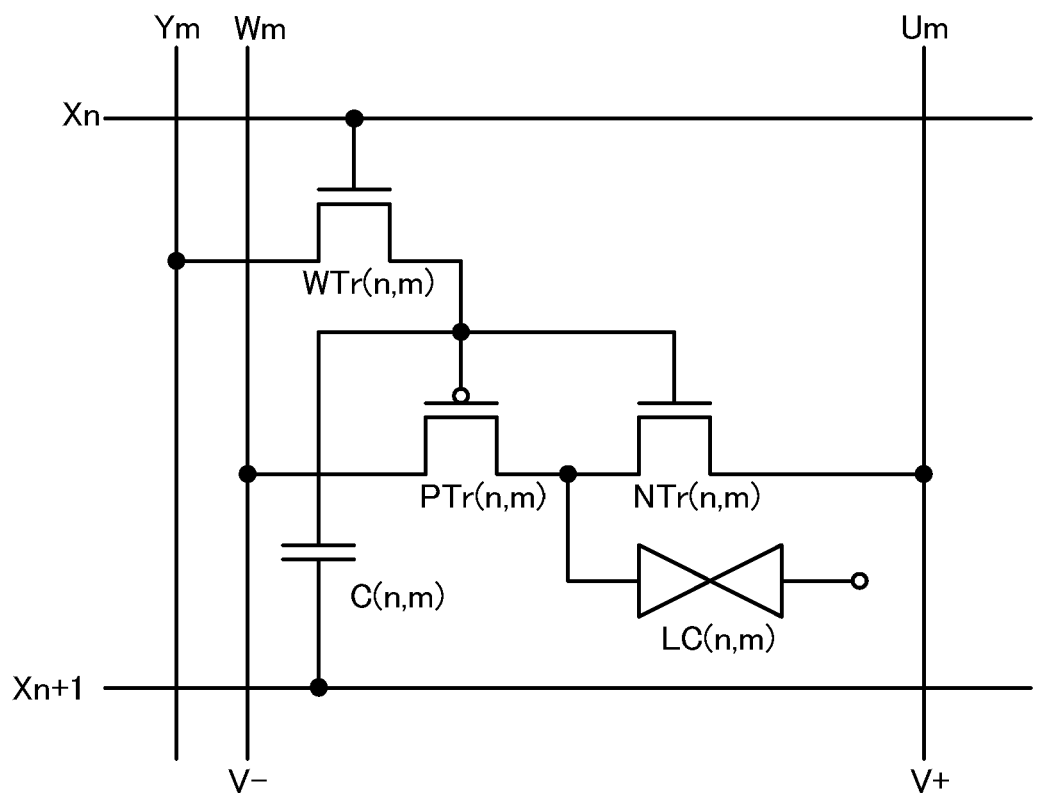

The difference between FIG. 1A and FIG. 7A (or between FIG. 4A and FIG. 7B) lies in that a scan line $X_{n+1}$ in the subsequent row is substituted for a capacitor line in FIG. 7A (or FIG. 7B), while the capacitor line is provided in FIG. 1A (or FIG. 4A).

With this structure, the number of total wirings can be reduced and an aperture ratio of a pixel can be increased. For example, in the case of a matrix having N rows and M columns (N and M are each a natural number greater than or equal to 2), the display devices having the circuit configurations of FIGS. 7A and 7B have (3N+M+1) wirings and (2N+3M+1) wirings, respectively, while the display devices having the circuit configurations of FIG. 1A and FIG. 4A have (4N+M) wirings and (2N+3M) wirings, respectively. Thus, the number of wirings in FIG. 7A can be smaller by N−1 than that in FIG. 1A; the number of wirings in FIG. 7B can be smaller by N−1 than that in FIG. 4A.

Further, in FIG. 7A, the number of wirings crossed by a signal line can be reduced, which allows a reduction in parasitic capacitance and suppression of attenuation of a display signal.

The electro-optical display devices of this embodiment can be driven by a method the same as that in FIGS. 3A to 3F.

(Embodiment 5)

Figure 8A:
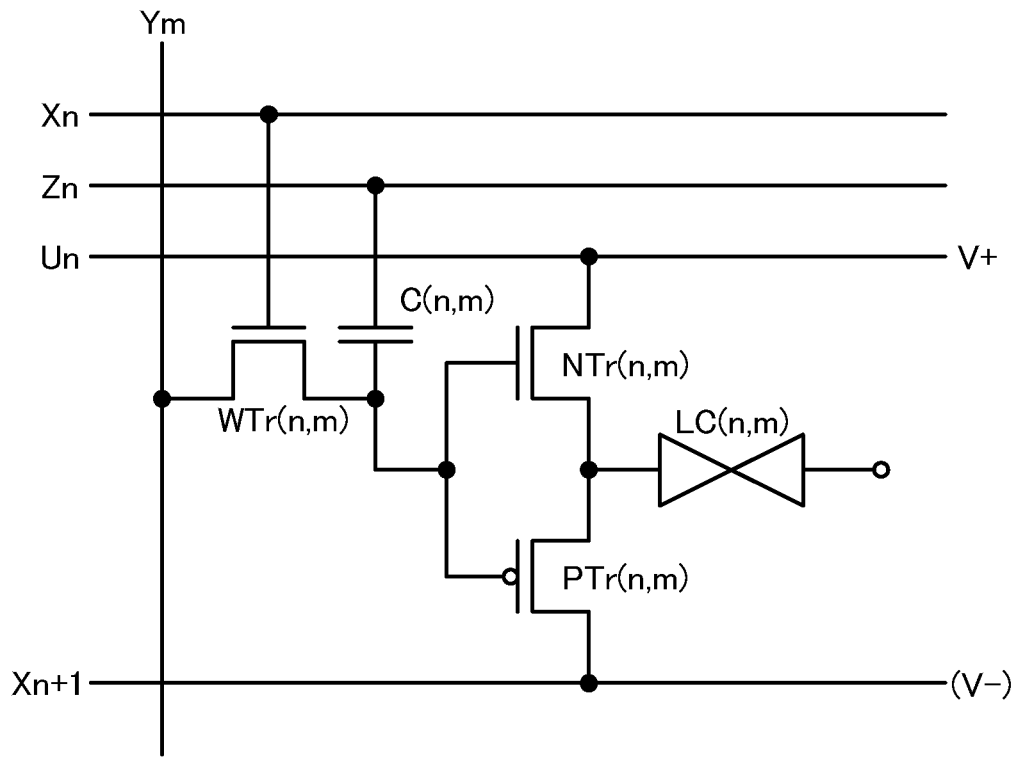
FIGS. 8A and 8B illustrate examples of circuits of an electro-optical display device of the present invention.
Figure 8B:
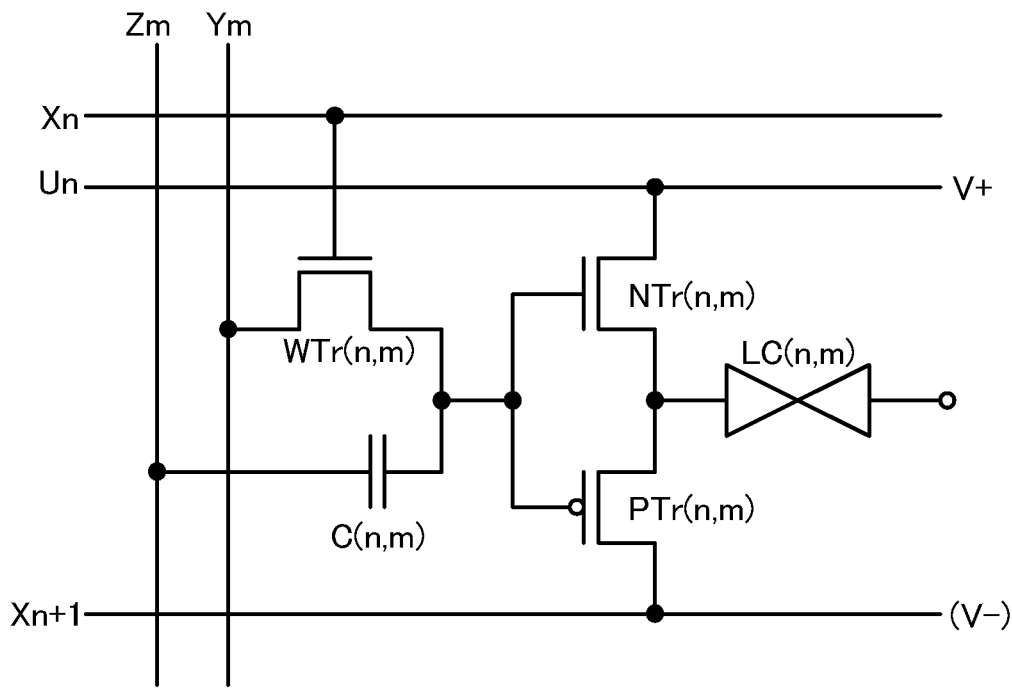
Figure 9A:
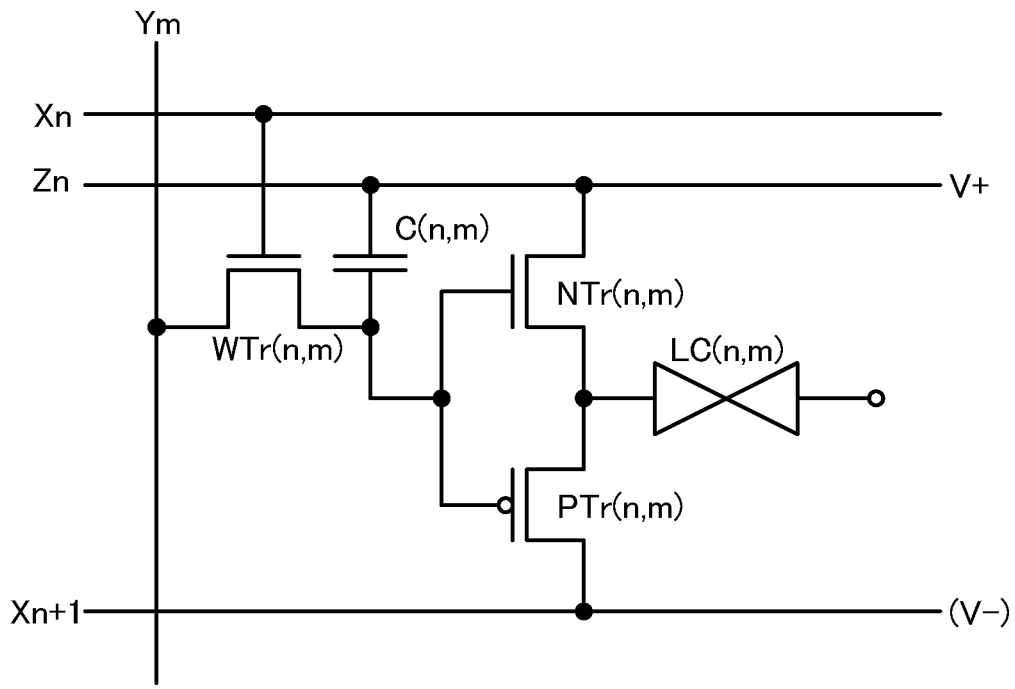
FIGS. 9A and 9B illustrate examples of circuits of an electro-optical display device of the present invention.
Figure 9B:
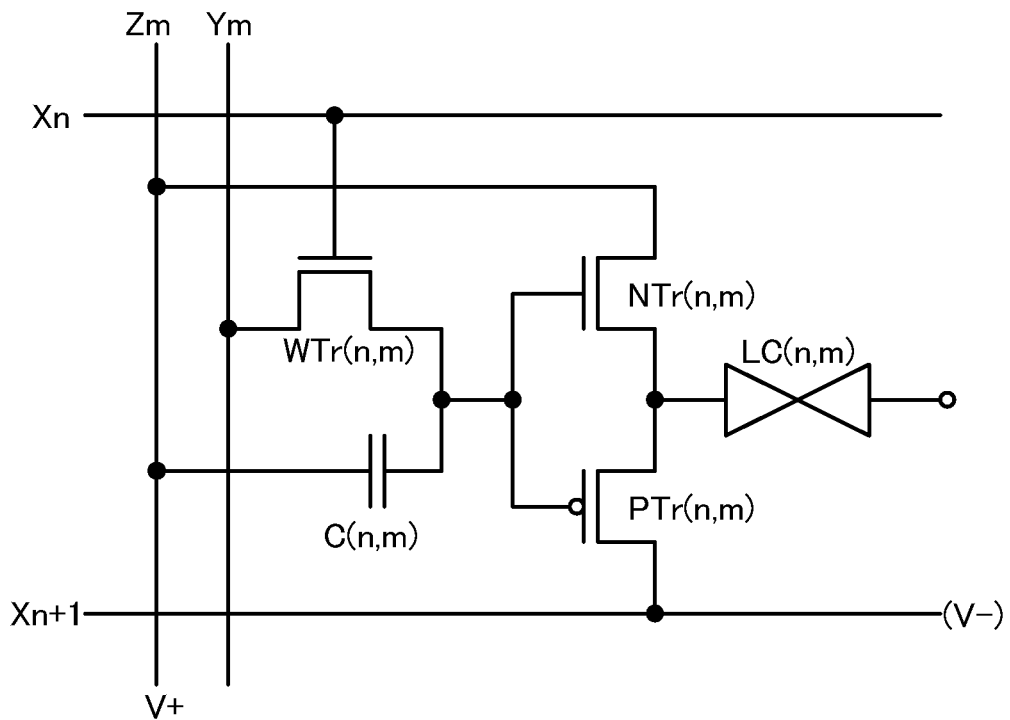

In this embodiment, electro-optical display devices illustrated in FIGS. 8A and 8B and electro-optical display devices illustrated in FIGS. 9A and 9B will be described. The electro-optical display devices illustrated in FIGS. 8A and 8B are obtained by modifying the electro-optical display devices illustrated in FIGS. 1A and 1B, respectively. The electro-optical display devices illustrated in FIGS. 9A and 9B are obtained by modifying the electro-optical display devices illustrated in FIGS. 5A and 5B, respectively.

The difference between FIG. 1A and FIG. 8A (between FIG. 1B and FIG. 8B, between FIG. 5A and FIG. 9A, or between FIG. 5B and FIG. 9B) lies in that a scan line $X_{n+1}$ in the subsequent row is substituted for a low potential line in FIG. 8A (FIG. 8B, FIG. 9A, or FIG. 9B), while the low potential line is provided in FIG. 1A (FIG. 1B, FIG. 5A, or FIG. 5B).

With this structure, the number of total wirings can be reduced and an aperture ratio of a pixel can be increased. For example, in the case of a matrix having N rows and M columns (N and M are each a natural number greater than or equal to 2), the display devices having the circuit configurations of FIGS. 8A and 8B have (3N+M+1) wirings and (2N+2M+1) wirings, respectively, while the display devices having the circuit configurations of FIGS. 1A and 1B have (4N+M) wirings and (3N+2M) wirings, respectively. Thus, the number of wirings in FIG. 8A can be smaller by N−1 than that in FIG. 1A; the number of wirings in FIG. 8B can be smaller by N−1 than that in FIG. 1B.

Further, in FIG. 8A, the number of wirings crossed by a signal line can be reduced, which allows a reduction in parasitic capacitance and suppression of attenuation of a display signal.

It is preferable that a selection transistor in each of the electro-optical display devices of this embodiment be an N-channel transistor. In that case, the scan line is designed so that the scan line has potential whose value is less than or equal to the minimum value of potential applied to one electrode of a display element, and thus is suitable for being used as the low potential line. Thus, the electro-optical display device of this embodiment can be driven by a method the same as that in FIGS. 3A to 3F.

(Embodiment 6)

Figure 10:
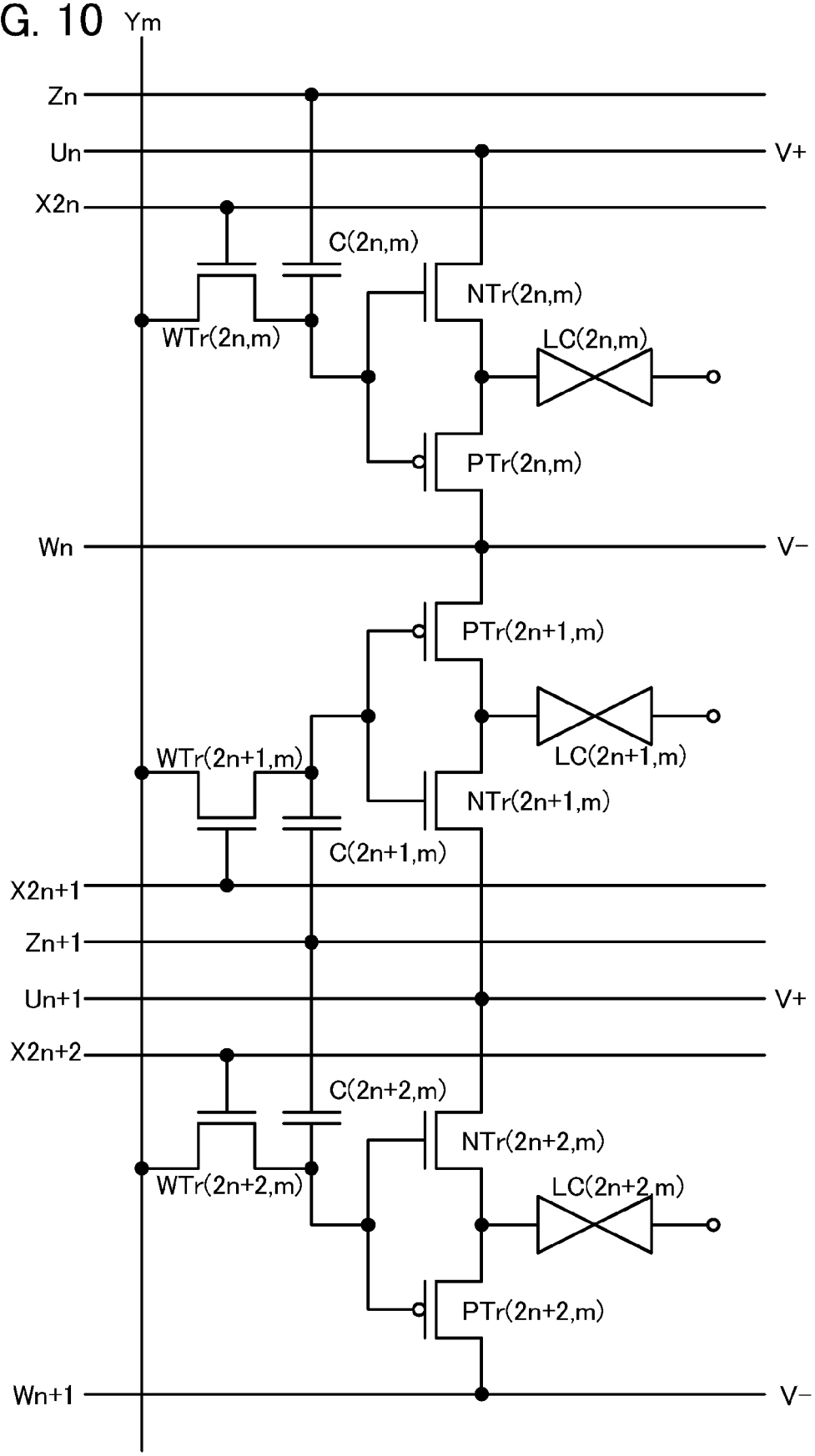
FIG. 10 illustrates an example of a circuit of an electro-optical display device of the present invention.

In this embodiment, an electro-optical display device illustrated in FIG. 10 will be described. The electro-optical display device illustrated in FIG. 10 is obtained by modifying the electro-optical display device illustrated in FIG. 1A. In FIG. 10, the capacitor line and the high potential line are shared by adjacent rows, and the low potential line is shared by adjacent rows. With such a structure, the number of total wirings can be reduced and an aperture ratio of a pixel can be increased.

Further, the number of wirings crossed by a signal line can be reduced, which allows a reduction in parasitic capacitance and suppression of attenuation of a display signal.

The electro-optical display device of this embodiment can be driven by a method the same as that in FIGS. 3A to 3F.

(Embodiment 7)

In this embodiment, electro-optical display devices illustrated in FIGS. 11A and 11B will be described. The electro-optical display devices illustrated in FIGS. 11A and 11B are obtained by modifying the electro-optical display devices illustrated in FIGS. 9A and 9B, respectively.

Figure 11A:
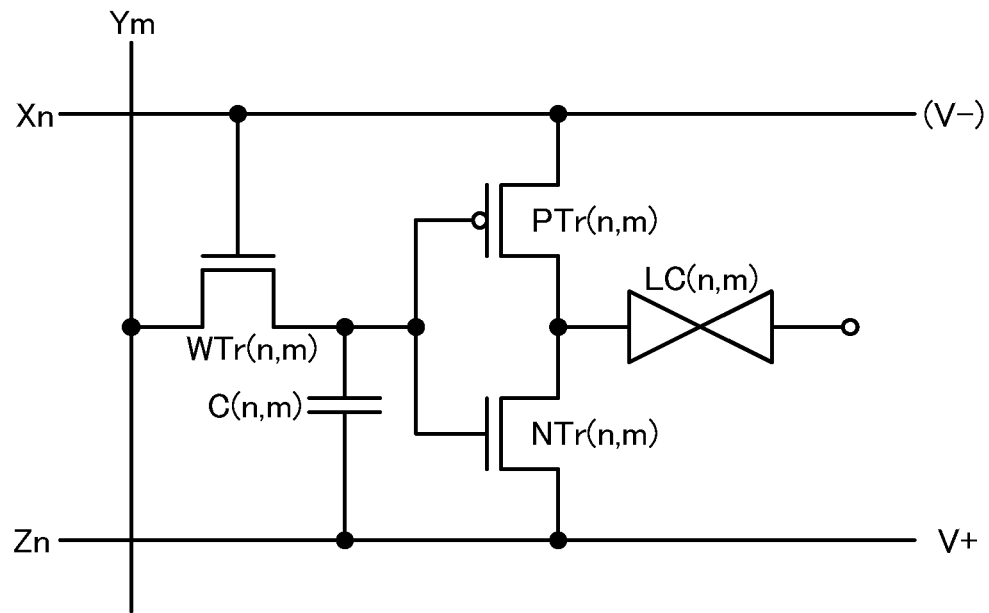
FIGS. 11A and 11B illustrate examples of circuits of an electro-optical display device of the present invention.
Figure 11B:
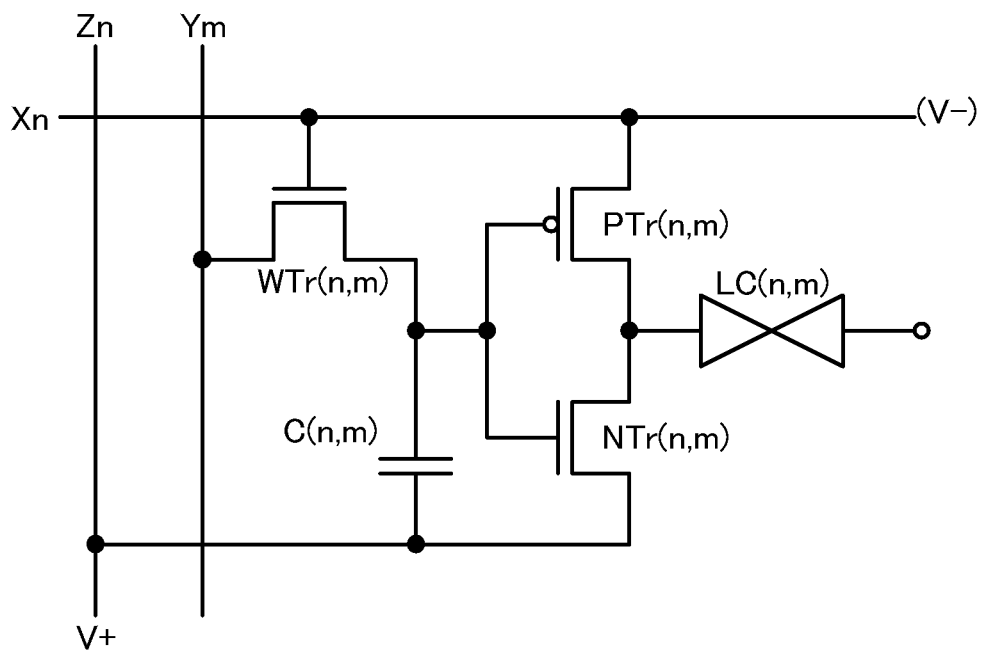

The difference between FIG. 9A and FIG. 11A (or between FIG. 9B and FIG. 11B) lies in that a drain of a P-channel driving transistor is connected to a scan line $X_n$ in the row in FIG. 11A (or FIG. 11B), while the drain of the P-channel driving transistor is connected to a scan line $X_{n+1}$ in the subsequent row in FIG. 9A (or FIG. 9B).

It is preferable that a selection transistor in each of the electro-optical display devices of this embodiment be an N-channel transistor. In that case, the scan line is designed so that the scan line has potential whose value is less than or equal to the minimum value of potential applied to one electrode of a display element, and thus is suitable for being connected to the drain of the P-channel driving transistor (i.e., being used as a low potential line).

Note that, although the P-channel driving transistor is on and the scan line $X_n$ is in a high potential state (in the case where the selection transistor is an N-channel transistor) when data is written, the scan line $X_n$ is in a low potential state when the data writing is finished; thus, in some cases, the potential of a gate of the P-channel driving transistor is greatly varied due to variation in the potential of the scan line. In order to avoid such an influence, the capacitance of a capacitor is preferably set to be greater than or equal to 10 times as high as the gate capacitance of the P-channel driving transistor.

(Embodiment 8)

In this embodiment, an example of a manufacturing method of the electro-optical display devices described in Embodiments 1 to 7 will be described. Although FIGS. 12A to 12E are cross-sectional views illustrating a manufacturing process of this embodiment, they conceptually illustrate a manufacturing process and does not illustrate a particular cross section.

First, an appropriate substrate 101 made of glass or another material is prepared. A surface of the substrate 101 may be coated with a covering film such as a silicon oxide film, a silicon nitride film, an aluminum oxide film, or an aluminum nitride film.

Next, a crystalline semiconductor covering film of polycrystalline silicon, single crystal silicon, or the like is formed over the substrate 101 and is processed into island-shaped semiconductor regions 102a and 102b. The island-shaped semiconductor regions 102a and 102b are used in an N-channel driving transistor and a P-channel driving transistor, respectively. Thus, an appropriate amount of donor or acceptor corresponding to each of the N-channel driving transistor and the P-channel driving transistor may be added. For example, a small amount of boron may be added to the island-shaped semiconductor region 102a to be a P-type semiconductor with low conductivity, and a small amount of phosphorus may be added to the island-shaped semiconductor region 102b to be an N-type semiconductor with low conductivity.

Furthermore, an insulating film 103 of silicon oxide or the like is formed so as to cover the island-shaped semiconductor regions 102a and 102b. The insulating film 103 may be a multilayer of materials and may include an amorphous film with high dielectric constant such as an aluminum oxide film, a lanthanum oxide film, or a hafnium oxide film. The insulating film 103 serves as a gate insulating film in the N-channel driving transistor and the P-channel driving transistor.

Figure 12A:
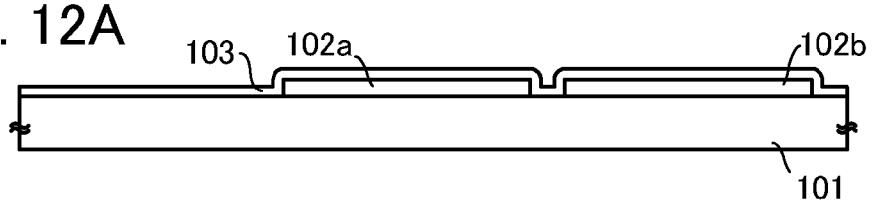
FIGS. 12A to 12E illustrate an example of a manufacturing process of an electro-optical display device of the present invention.

The thickness of the insulating film 103 may be determined as appropriate. However, if the thickness is too small, leakage current is increased to adversely affect the display performance of the electro-optical display device, whereas if the thickness is too large, the characteristics of the N-channel driving transistor and the P-channel driving transistor are deteriorated. Thus, the thickness of the insulating film 103 is preferably 10 nm to 50 nm, more preferably 20 nm to 30 nm. The insulating film 103 may be formed by a plasma CVD method, a low-pressure CVD method, or the like. FIG. 12A illustrates the state up to this point.

Figure 12B:
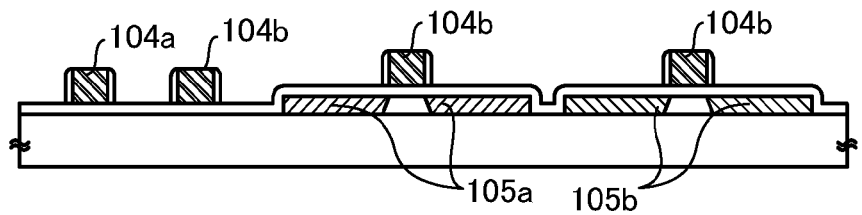

Next, a single-layer metal film or a multilayer metal film is formed and processed into wirings 104a and 104b. Sidewalls may be formed on side surfaces of the wirings 104a and 104b as illustrated in FIG. 12B. In FIG. 12B, three cross sections of the wiring 104b correspond to cross sections of three parts of the wiring 104b. In addition, the wiring 104a is used as, for example, part of a signal line in some cases.

A material which forms an ohmic contact with an oxide semiconductor to be formed later is preferable as a material of the wirings 104a and 104b. An example of such a material is a material whose work function W is almost the same as or smaller than electron affinity φ (an energy gap between the lowest end of the conduction band of the oxide semiconductor and the vacuum level) of the oxide semiconductor. In other words, W<φ+0.3 [eV] is satisfied. As examples of the material, titanium, molybdenum, and titanium nitride are given.

Further, the wiring 104b also serves as gates of the N-channel driving transistor and the P-channel driving transistor; thus, a material which has an appropriate physical property value such as a work function is preferable for determining the threshold voltage of the transistors. When these conditions are not satisfied by one material, a multilayer film may be formed so that each condition is satisfied by each film. For example, a multilayer film of a titanium nitride film and a tantalum nitride film may be used as the wirings 104a and 104b.

Although the example in which the same wiring is used as the gates of the N-channel driving transistor and the P-channel driving transistor is illustrated in FIG. 12B, the gates may be formed using different materials in order to specifically control the threshold voltages.

After that, an impurity serving as a donor or an acceptor is added by a known doping technique, so that N-type regions 105a are formed in the island-shaped semiconductor region 102a and P-type regions 105b are formed in the island-shaped semiconductor region 102b. The N-type regions 105a serve as a source and a drain of the N-channel driving transistor. The P-type regions 105b serve as a source and a drain of the P-channel driving transistor. Regions with different dopant concentrations may be formed in each of the N-type region 105a and the P-type region 105b. For example, the dopant concentrations of regions closer to the wirings 104a and 104b may be 1% to 10% of those of other regions. FIG. 12B illustrates the state up to this point.

After that, heat treatment at 250° C. to 450° C. is preferably performed in a hydrogen atmosphere so that a state of an interface between the insulating film 103 and each of the island-shaped semiconductor regions 102a and 102b is improved. It is preferable to perform oxygen plasma treatment after this heat treatment so that the hydrogen concentration of an exposed portion of the insulating film 103 is particularly reduced. The hydrogen concentration in the insulating film 103 may be lower than $1\times10^{18}$ cm$^{-3}$, preferably lower than $1\times10^{16}$ cm$^{-3}$.

Note that surfaces of the wirings 104*a* and 104*b* are oxidized by the oxygen plasma treatment. The surfaces of the wirings 104*a* and 104*b* in this state each have a contact failure with an oxide semiconductor which is formed later; thus, the oxidized portions are preferably removed after the oxygen plasma treatment. Typically, a so-called reverse sputtering method may be used.

Next, an oxide semiconductor film is formed to a thickness of 3 nm to 30 nm by a sputtering method. A method other than a sputtering method may be employed as a formation method of the oxide semiconductor film. The oxide semiconductor preferably contains gallium and indium. The hydrogen concentration in the oxide semiconductor film may be lower than $1\times10^{18}$ cm$^{-3}$, preferably lower than $1\times10^{16}$ cm$^{-3}$ in order that the reliability of a semiconductor memory device is increased. The composition ratio of gallium to indium (i.e., gallium/indium) is greater than or equal to 0.5 and less than 2, preferably greater than or equal to 0.9 and less than 1.2. The oxide semiconductor may contain zinc in addition to gallium and indium.

This oxide semiconductor film is etched, so that an island-shaped oxide semiconductor region 106 is formed. It is preferable to perform heat treatment on the oxide semiconductor region 106 so that the semiconductor characteristics are improved. The same effect can also be obtained by performing oxygen plasma treatment. The heat treatment and the oxygen plasma treatment may be performed separately or at the same time. Thus, a structure in which the wirings 104*a* and 104*b* are in contact with the oxide semiconductor region 106 can be obtained.

After that, an insulating film 107 is formed by a known deposition method such as a sputtering method. For the purpose of reducing leakage current, the thickness of the insulating film 107 is preferably greater than or equal to 10 nm, and the hydrogen concentration in the insulating film 107 is preferably lower than $1\times10^{18}$ cm$^{-3}$, more preferably lower than $1\times10^{16}$ cm$^{-3}$. In order to obtain such a hydrogen concentration, heat treatment, chlorine plasma treatment, or oxygen plasma treatment is preferably performed. In addition, in order to improve the characteristics of the oxide semiconductor region 106, heat treatment may also be performed after the insulating film 107 is formed.

Silicon oxide, aluminum oxide, hafnium oxide, lanthanum oxide, aluminum nitride, or the like may be used for the insulating film 107. Alternatively, a composite oxide having a band gap greater than or equal to 6 eV and less than or equal to 8 eV, such as a composite oxide of aluminum and gallium (the ratio of aluminum to gallium (i.e., aluminum/gallium) is preferably greater than or equal to 0.5 and less than or equal to 3), may be used. A multilayer film of these materials may be used as well as a single-layer film thereof.

The insulating film 107 serves as a gate insulating film of a selection transistor. In addition, the insulating film 107 serves as a dielectric of a capacitor in many cases.

Figure 12C:
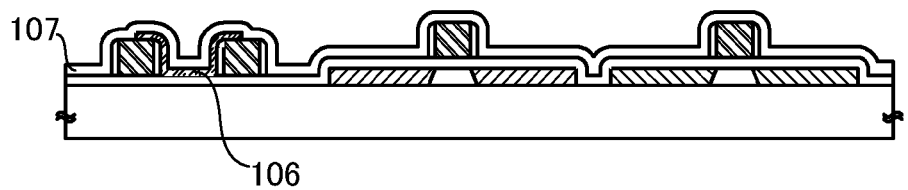

On the other hand, the insulating film 107 also serves as an interlayer insulator at an intersection between a signal line and a scan line; thus, a material and a thickness suitable for these purposes need to be selected. In general, in the case where the insulating film 107 is used as an interlayer insulator, the insulating film 107 preferably has a large thickness and low dielectric constant, while in the case where the insulating film 107 is used as a gate insulating film, the insulating film 107 preferably has a small thickness and high dielectric constant. It is difficult to achieve such contradicting purposes with one material; thus, a thick film with low dielectric constant may be additionally provided in part of the insulating film 107, which is used as an interlayer insulator. FIG. 12C illustrates the state up to this point.

After that, wirings 108*a*, 108*b*, 108*c*, and 108*d* are formed of a conductive material. The wirings 108*a*, 108*b*, 108*c*, and 108*d* each serve as a gate of the selection transistor or an electrode connected to a source or a drain of the N-channel driving transistor or the P-channel driving transistor. In addition, the wiring 108*a* serves as a scan line.

Figure 12D:
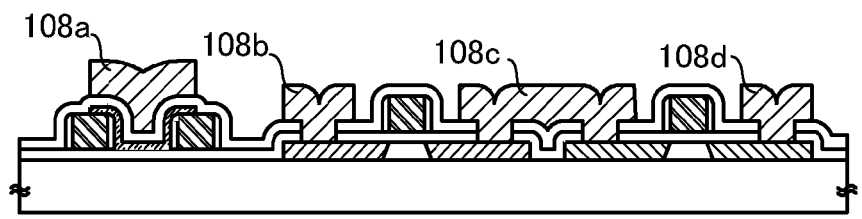

It is preferable that in each of the wirings 108*a*, 108*b*, 108*c*, and 108*d*, a material used in a portion in contact with the oxide semiconductor have a work function higher than the electron affinity of the oxide semiconductor by 0.5 eV or more. As examples of such a material, tungsten, gold, platinum, p-type silicon, and the like are given. Needless to say, a material having lower resistance may be provided in an upper layer in order to increase conductivity. FIG. 12D illustrates the state up to this point.

Figure 12E:
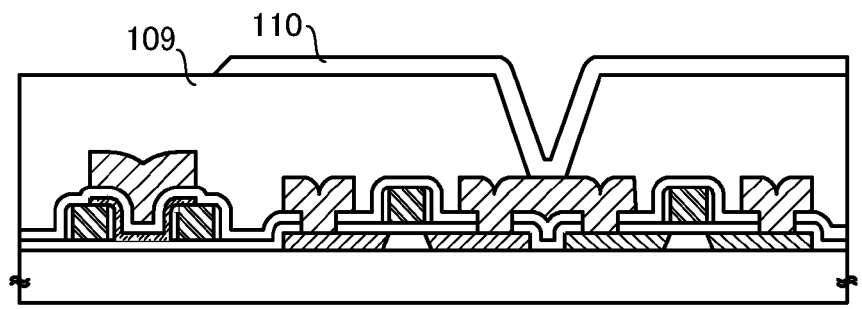

After that, an interlayer insulator 109 which is formed of a single-layer insulating film or a multilayer insulating film and has a flat surface is formed. The interlayer insulator 109 is selectively etched, so that a contact hole reaching the wiring 108*c* is formed. Then, one electrode 110 of a display element is formed of a transparent conductive covering film. Through the above steps, a circuit of the electro-optical display device is almost completed. FIG. 12E illustrates the state up to this point.

Figure 14A:
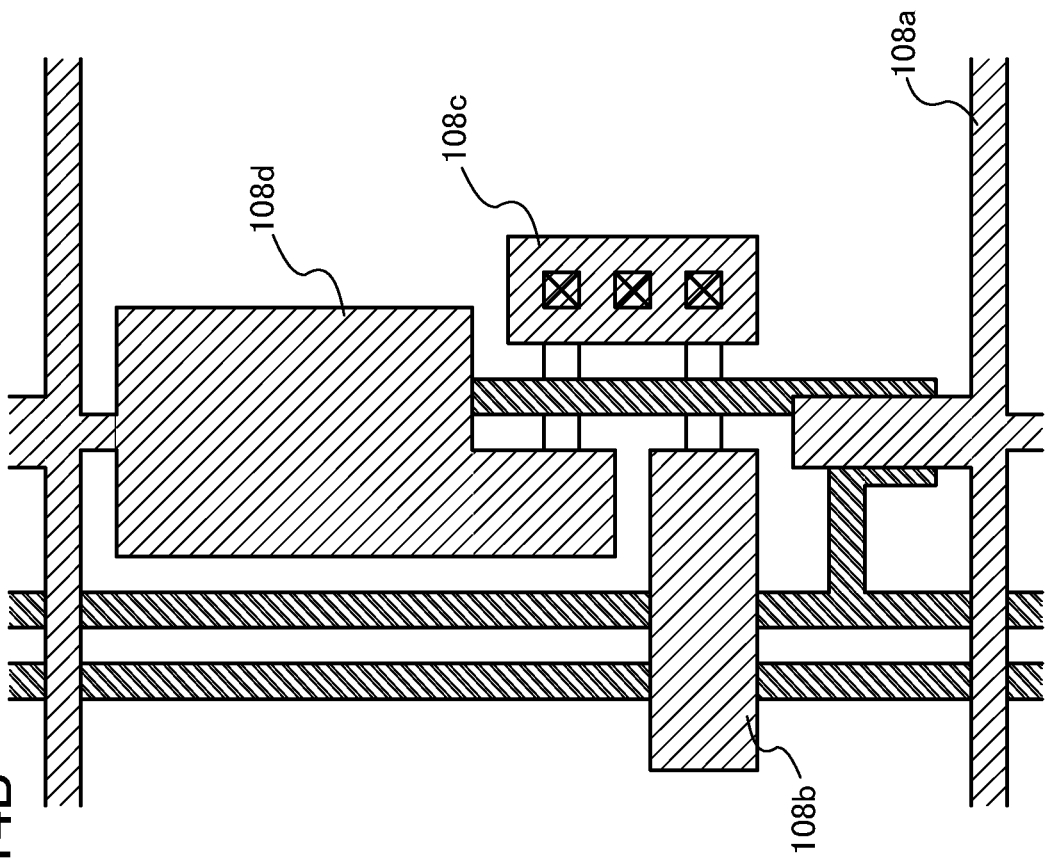
FIGS. 14A and 14B each illustrate an example of circuit arrangement of an electro-optical display device of the present invention.
Figure 14B:
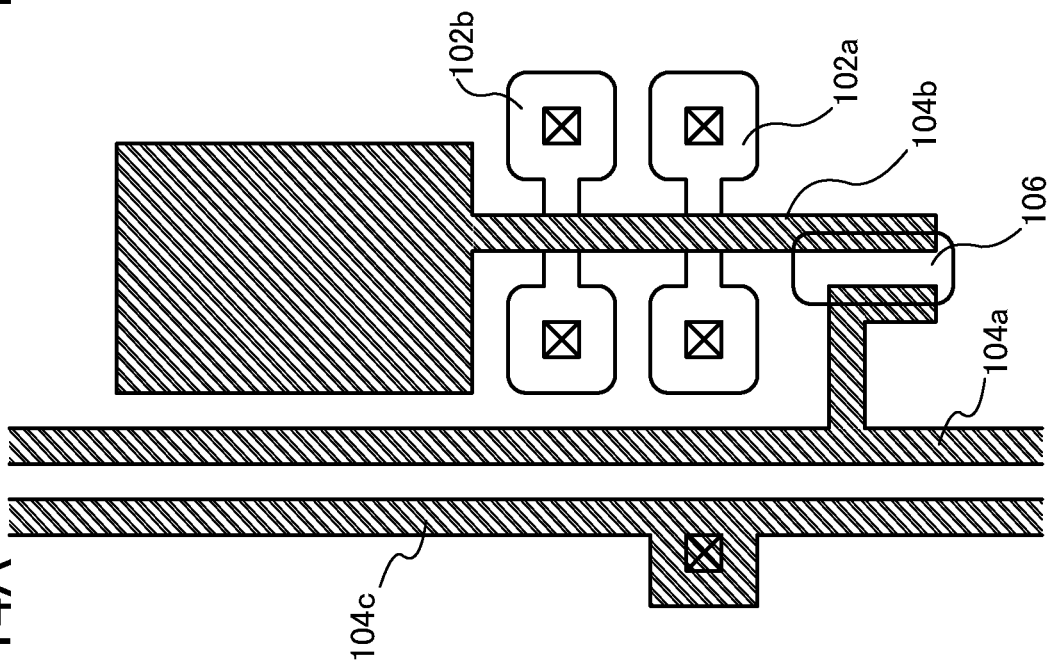

FIGS. 14A and 14B each illustrate an example of circuit arrangement of a pixel in the electro-optical display device obtained through the above manufacturing process. FIG. 14A corresponds to the stage illustrated in FIG. 12C and illustrates the state after the oxide semiconductor region 106 is formed (or after the insulating film 107 is formed), which is seen from the above. The reference numerals in FIG. 14A correspond to those in FIGS. 12A to 12E. Note that some elements such as the insulating film 103 and the insulating film 107 are not illustrated in FIGS. 14A and 14B.

The wiring 104*a* is a drain of the selection transistor and is also a signal line. The wiring 104*b* serves as both a source of the selection transistor and gates of the N-channel driving transistor and the P-channel driving transistor. One end of the wiring 104*b* has a large width and serves as one electrode of a capacitor here. A portion for connection to an upper layer is provided in each of the wiring 104*a* and the island-shaped semiconductor regions 102*a* and 102*b*. In addition, the wiring 104*c* serves as a high potential line. Note that the wiring 104*c* is not illustrated in FIGS. 12A to 12E.

FIG. 14B corresponds to the stage illustrated in FIG. 12D and illustrates the state after the wirings 108*a*, 108*b*, 108*c*, and 108*d* are formed, which is seen from the above. The reference numerals in FIG. 14B correspond to those in FIGS. 12A to 12E.

The wiring 108*a* serves as a gate of the selection transistor and also serves as a scan line in the row. The wiring 108*b* is provided so as to cross the wiring 104*a*, is in contact with the connection portion provided in the wiring 104*c* which serves as the high potential line, and is in contact with the connection portion provided in the island-shaped semiconductor region 102*a* (i.e., a drain of the N-channel driving transistor), whereby the wiring 108*b* functions as a connection electrode which connects the high potential line to the drain of the N-channel driving transistor.

The wiring 108*c* is in contact with the connection portion provided in the island-shaped semiconductor region 102*a* (i.e., a source of the N-channel driving transistor) and the connection portion provided in the island-shaped semiconductor region 102b (i.e., a source of the P-channel driving transistor), whereby the wiring 108c functions as a connection electrode which connects the source of the N-channel driving transistor to the source of the P-channel driving transistor. In addition, in the wiring 108c, a connection portion for connection to the one electrode of the display element provided over the wiring 108c is provided. In this embodiment, a plurality of connection portions (three connection portions in FIG. 14B) are provided by utilizing the large area of the wiring 108c, so that the probability of connection failure is reduced.

The wiring 108d serves as a scan line in the subsequent row. The wiring 108d is in contact with the connection portion provided in the island-shaped semiconductor region 102b (i.e., a drain of the P-channel driving transistor), whereby the wiring 108d functions as a connection electrode which connects the drain of the P-channel driving transistor to the scan line in the subsequent row. In addition, the wiring 108d also functions as the other electrode of the capacitor and a low potential line.

(Embodiment 9)

In this embodiment, an example of a manufacturing method of the electro-optical display devices described in Embodiments 1 to 7 will be described. Although FIGS. 13A to 13E are cross-sectional views illustrating a manufacturing process of this embodiment, they conceptually illustrate a manufacturing process and does not illustrate a particular cross section. Note that as many of the methods, materials, and the like in this embodiment, the methods, materials, and the like described in Embodiment 8 can be used. Therefore, the description is omitted except for the case of using particularly different material and conditions.

Figure 13A:
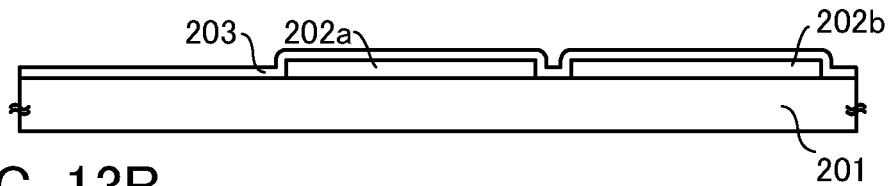
FIGS. 13A to 13E illustrate an example of a manufacturing process of an electro-optical display device of the present invention.

First, a substrate 201 is prepared. Then, over the substrate 201, island-shaped semiconductor regions 202a and 202b are formed of a crystalline semiconductor covering film such as a polycrystalline silicon film or a single crystal silicon film. Furthermore, an insulating film 203 is formed so as to cover the island-shaped semiconductor regions 202a and 202b. FIG. 13A illustrates the state up to this point.

Figure 13B:
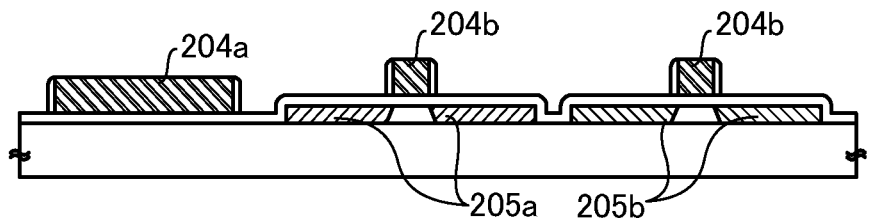

Next, wirings 204a and 204b are formed of a single-layer metal film or a multilayer metal film. Sidewalls may be formed on side surfaces of the wirings 204a and 204b as illustrated in FIG. 13B. The wiring 204a is used as, for example, part of a scan line.

The wiring 204a serves as a gate of a selection transistor using an oxide semiconductor which is formed later. Thus, it is preferable that a material used in an upper portion of the wiring 204a have a work function higher than the electron affinity of the oxide semiconductor by 0.5 eV or more. As examples of such a material, tungsten, gold, platinum, p-type silicon, and the like are given. Needless to say, a material having lower resistance may be provided in an lower layer in order to increase conductivity.

Further, the wiring 204b also serves as gates of the N-channel driving transistor and the P-channel driving transistor; thus, a material for a lower part of the wiring 204b, which has an appropriate physical property value such as a work function, is preferable for determining the threshold voltage of the transistors. When these conditions are not satisfied by one material, a multilayer film may be formed so that each condition is satisfied by each film. For example, a multilayer film of a titanium nitride film and a tungsten film may be used.

Although the example in which the same wiring is used as the gates of the N-channel driving transistor and the P-channel driving transistor is illustrated in FIG. 13B, the gates may be formed using different materials in order to specifically control the threshold voltages.

After that, N-type regions 205a are formed in the island-shaped semiconductor region 202a and P-type regions 205b are formed in the island-shaped semiconductor region 202b by a known doping technique. After that, heat treatment at 250° C. to 450° C. is preferably performed in a hydrogen atmosphere. FIG. 13B illustrates the state up to this point.

Next, an insulating film 206 is formed by a known deposition method such as a sputtering method. The insulating film 206 serves as a gate insulating film of the selection transistor. It is preferable that the thickness of the insulating film 206 be greater than or equal to 10 nm and that the hydrogen concentration in the insulating film 206 be lower than $1\times10^{18}$ cm$^{-3}$, more preferably lower than $1\times10^{16}$ cm$^{-3}$. In order to obtain such a hydrogen concentration, heat treatment, chlorine plasma treatment, or oxygen plasma treatment is preferably performed.

After that, an oxide semiconductor film is formed to a thickness of 3 nm to 30 nm by a sputtering method and is etched, so that an island-shaped oxide semiconductor region 207 is formed. Furthermore, over an entire surface, an interlayer insulator 208 is formed of a material such as silicon oxide. The interlayer insulator 208 may be formed using not only a single-layer film but also a multilayer film.

Figure 13C:
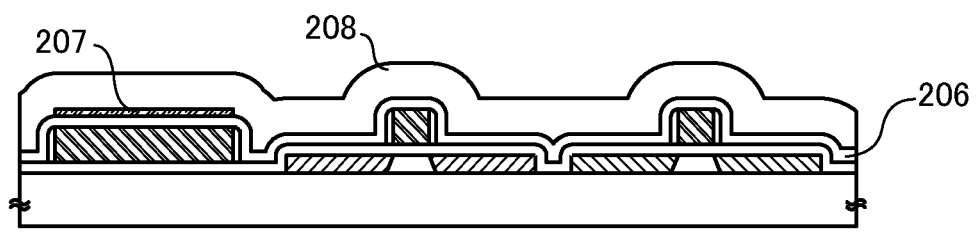

Further, the interlayer insulator 208 and the insulating film 206 which overlap with each other over the wirings 204a and 204b serve as dielectrics of a capacitor in many cases. On the other hand, the interlayer insulator 208 and the insulating film 206 also serve as interlayer insulators at an intersection portion of a signal line and a scan line; thus, a material and a thickness suitable for these purposes need to be selected. In general, in the case where the interlayer insulator 208 and the insulating film 206 are used as interlayer insulators, they preferably have a large thickness and low dielectric constant, while in the case where the interlayer insulator 208 and the insulating film 206 are used as dielectrics of a capacitor, they preferably have a small thickness and high dielectric constant. However, in this embodiment, the capacitance of the capacitor does not particularly need to be increased; thus, even when the interlayer insulator 208 has a thickness which is used for a normal interlayer insulator, the interlayer insulator 208 can be used as a dielectric of the capacitor. FIG. 13C illustrates the state up to this point.

After that, wirings 209a, 209b, 209c, 209d, and 209e are formed of a conductive material. The wirings 209a, 209b, 209c, 209d, and 209e each serve as an electrode connected to a source or a drain of the selection transistor, the N-channel driving transistor, or the P-channel driving transistor. In addition, the wiring 209a serves as a signal line.

Figure 13D:
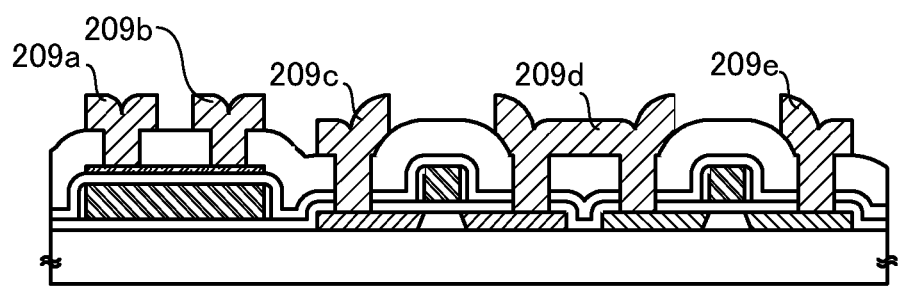

A material which forms an ohmic contact with an oxide semiconductor is preferable as a material of the wirings 209a, 209b, 209c, 209d, and 209e. An example of such a material is a material whose work function W is almost the same as or smaller than electron affinity φ (an energy gap between the lowest end of the conduction band of the oxide semiconductor and the vacuum level) of the oxide semiconductor. In other words, $W<\phi+0.3$ [eV] is satisfied. As examples of the material, titanium, molybdenum, and titanium nitride are given. FIG. 13D illustrates the state up to this point.

Figure 13E:
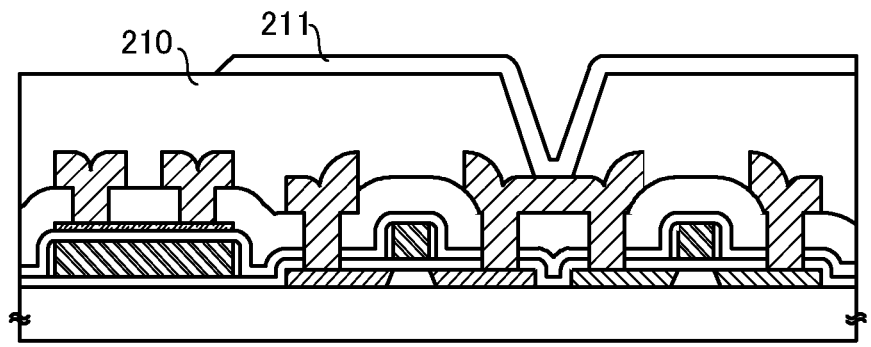

After that, an interlayer insulator 210 which has a flat surface is formed and is selectively etched, so that a contact hole reaching the wiring 209d is formed. Then, one electrode 211 of a display element is formed of a transparent conductive covering film. Through the above steps, a circuit of the electro-optical display device is almost completed. FIG. 13E illustrates the state up to this point.

Figure 15A:
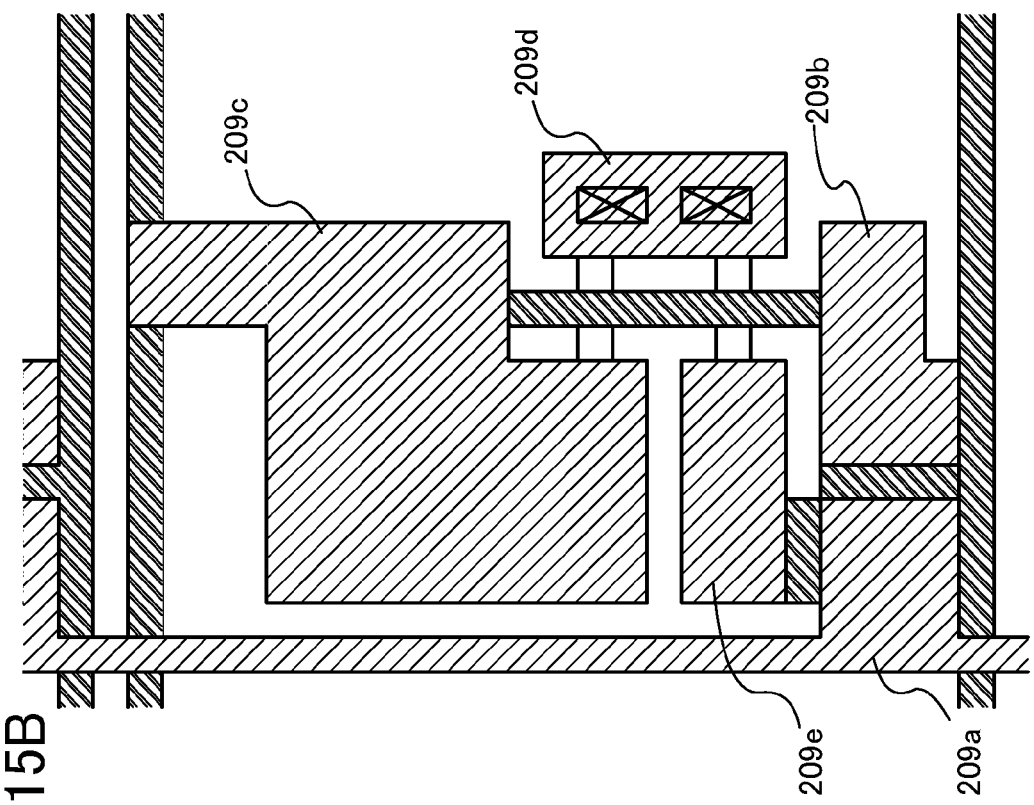
FIGS. 15A and 15B each illustrate an example of circuit arrangement of an electro-optical display device of the present invention.
Figure 15B:
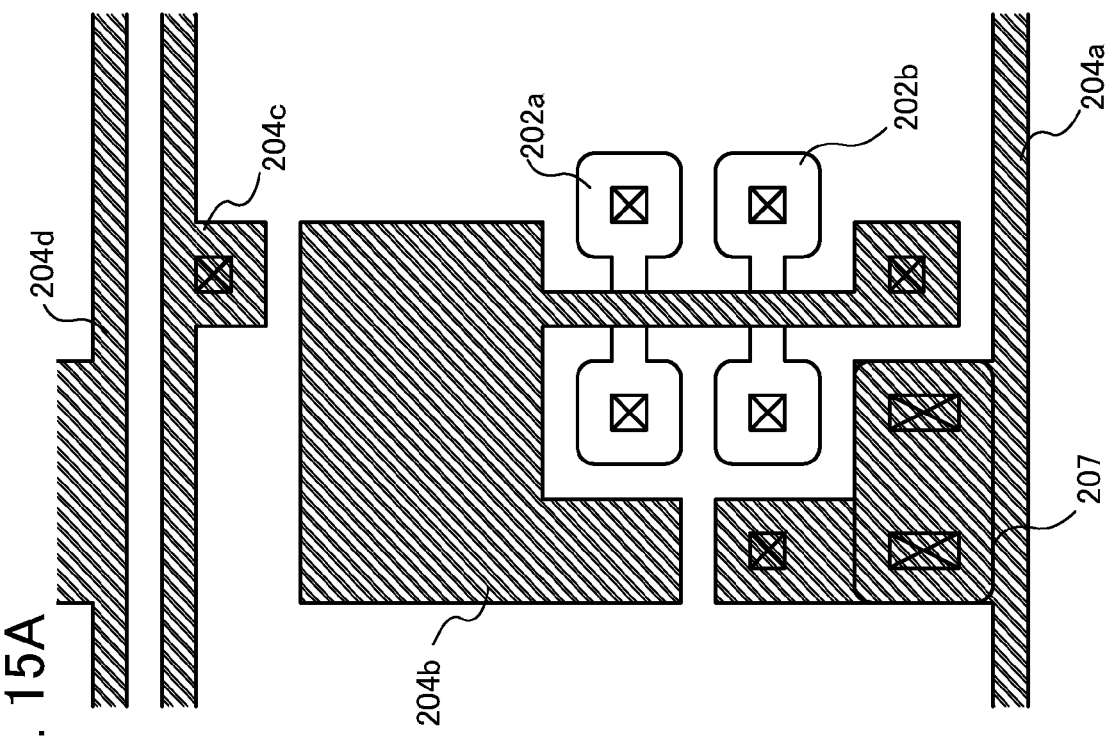

FIGS. 15A and 15B each illustrate an example of circuit arrangement of a pixel in the electro-optical display device obtained through the above manufacturing process. FIG. 15A corresponds to the stage illustrated in FIG. 13C and illustrates the state after the oxide semiconductor region 207 is formed (or after the interlayer insulator 208 is formed), which is seen from the above. The reference numerals in FIG. 15A correspond to those in FIGS. 13A to 13E. Note that the insulating film 203, the insulating film 206, the interlayer insulator 208, and the like are not illustrated in FIGS. 15A and 15B.

The wiring 204a serves as the gate of the selection transistor and also serves as a scan line in the row. The wiring 204b serves as gates of both the N-channel driving transistor and the P-channel driving transistor. One end of the wiring 104b has a large width and serves as one electrode of the capacitor. In addition, a wiring 204c which serves as a high potential line and a wiring 204d which serves as a scan line in the subsequent row are illustrated in FIG. 15A. Note that the wirings 204c and 204d are not illustrated in FIGS. 13A to 13E.

Portions for connection to upper layers are provided in the oxide semiconductor region 207, the wirings 204a, 204b, and 204c, and the island-shaped semiconductor regions 202a and 202b. Especially in the oxide semiconductor region 207, the area of each of the connection portions is increased, whereby the probability of connection failure is reduced.

FIG. 15B corresponds to the stage illustrated in FIG. 13D and illustrates the state after the wirings 209a, 209b, 209c, 209d, and 209e are formed, which is seen from the above. The reference numerals in FIG. 15B correspond to those in FIGS. 13A to 13E.

The wiring 209a serves as a drain of the selection transistor and also serves as a signal line. The wiring 209b is in contact with the connection portion provided in the wiring 204b, whereby the wiring 209b functions as a connection electrode which connects the source of the selection transistor to the wiring 204b The wiring 209c is in contact with the connection portion provided in the island-shaped semiconductor region 202a (i.e., the drain of the N-channel driving transistor) and is in contact with the connection portion provided in the wiring 204c which serves as the high potential line, whereby the wiring 209c functions as a connection electrode which connects the drain of the N-channel driving transistor to the high potential line. In addition, the wiring 209c also functions as the other electrode of the capacitor.

The wiring 209d is in contact with the connection portion provided in the island-shaped semiconductor region 202a (i.e., the source of the N-channel driving transistor) and the connection portion provided in the island-shaped semiconductor region 202b (i.e., the source of the P-channel driving transistor), whereby the wiring 209d functions as a connection electrode which connects the source of the N-channel driving transistor to the source of the P-channel driving transistor.

Further, in the wiring 209d, a portion for connecting the one electrode of the display element provided over the wiring 209d is provided. In this embodiment, a plurality of connection portions (two connection portions in FIG. 15B) are provided by utilization of the large area of the wiring 209d. Moreover, the area of each of the connection portions is increased, whereby the probability of connection failure is reduced.

The wiring 209e is in contact with the connection portion provided in the wiring 204a which serves as the scan line in the row and the connection portion provided in the island-shaped semiconductor region 202b (i.e., the drain of the P-channel driving transistor), whereby the wiring 209e functions as a connection electrode which connects the wiring 204a to the drain of the P-channel driving transistor. In that case, the wiring 204a functions as a low potential line as well as the scan line.

The electro-optical display device having the wirings illustrated in FIGS. 15A and 15B corresponds to the circuit illustrated in FIG. 11A.

(Embodiment 10)

In this embodiment, electronic devices using any of the electro-optical display devices described in Embodiments 1 to 9 will be described. These electro-optical display devices can be used for devices such as personal computers, portable communication devices, image display devices, video reproducing devices, imaging devices, game machines, and e-book readers.

This application is based on the Japanese Patent Application serial no. 2010-109825 filed with the Japan Patent Office on May 12, 2010, the entire contents of which are hereby incorporated by reference.

What is claimed is:

1. An electro-optical display device comprising a pixel, the pixel comprising:
    a first transistor comprising a channel formation region in an oxide semiconductor layer;
    a second transistor;
    a third transistor;
    a capacitor; and
    a display element,
    wherein a source of the first transistor is directly connected to a gate of the second transistor, a gate of the third transistor, and one electrode of the capacitor,
    wherein the display element comprises a first electrode and a second electrode,
    wherein a source of the second transistor and a source of the third transistor are directly connected to the first electrode of the display element,
    wherein a drain of the third transistor is connected to a low potential line,
    wherein the second transistor is an N-channel transistor and the third transistor is a P-channel transistor,
    wherein off-state current of the first transistor is less than or equal to $1 \times 10^{-20}$ A at a temperature of 25° C.,
    wherein the off-state current of the first transistor is less than or equal to 1/100 of leakage current of the display element, and
    wherein capacitance of the capacitor is less than or equal to 1/10 of capacitance of the display element.

2. The electro-optical display device according to claim 1, wherein a drain of the second transistor is connected to a high potential line.

3. The electro-optical display device according to claim 1, wherein a drain of the second transistor and the other electrode of the capacitor are connected to a capacitor line.

4. The electro-optical display device according to claim 1, wherein the first transistor is an N-channel transistor.

5. The electro-optical display device according to claim 1, wherein at least one of the second transistor and the third transistor comprises an oxide semiconductor.

6. The electro-optical display device according to claim 5, wherein the oxide semiconductor comprises at least one of indium, gallium, and zinc.

7. The electro-optical display device according to claim 1, wherein at least one of the second transistor and the third transistor comprises a polycrystalline semiconductor or a single crystal semiconductor.

8. The electro-optical display device according to claim 7, wherein the polycrystalline semiconductor is selected from polycrystalline silicon, polycrystalline silicon germanium, and polycrystalline germanium.

9. The electro-optical display device according to claim 7, wherein the single crystal semiconductor is selected from single crystal silicon, single crystal silicon germanium, and single crystal germanium.

10. The electro-optical display device according to claim 1, wherein the electro-optical display device comprises a blue phase liquid crystal.

11. The electro-optical display device according to claim 1, wherein a frame period is longer than or equal to 100 seconds.

12. The electro-optical display device according to claim 1, wherein time for writing of one screen in a frame is less than or equal to 0.2 milliseconds.

13. An electro-optical display device comprising a pixel, the pixel comprising:
a first transistor comprising a channel formation region in an oxide semiconductor layer;
a second transistor;
a third transistor;
a capacitor; and
a display element,
wherein a source of the first transistor is directly connected to a gate of the second transistor, a gate of the third transistor, and one electrode of the capacitor,
wherein the display element comprises a first electrode and a second electrode,
wherein a source of the second transistor and a source of the third transistor are directly connected to the first electrode of the display element,
wherein a gate of the first transistor is connected to a first scan line,
wherein a drain of the third transistor is connected to a second scan line,
wherein the second transistor is an N-channel transistor and the third transistor is a P-channel transistor,
wherein off-state current of the first transistor is less than or equal to $1\times10^{-20}$ A at a temperature of 25° C.,
wherein the off-state current of the first transistor is less than or equal to 1/100 of leakage current of the display element, and
wherein capacitance of the capacitor is less than or equal to 1/10 of capacitance of the display element.

14. The electro-optical display device according to claim 13, wherein a drain of the second transistor is connected to a high potential line.

15. The electro-optical display device according to claim 13, wherein a drain of the second transistor and the other electrode of the capacitor are connected to a capacitor line.

16. The electro-optical display device according to claim 13, wherein the first transistor is an N-channel transistor.

17. The electro-optical display device according to claim 13, wherein at least one of the second transistor and the third transistor comprises an oxide semiconductor.

18. The electro-optical display device according to claim 17, wherein the oxide semiconductor comprises at least one of indium, gallium, and zinc.

19. The electro-optical display device according to claim 13, wherein at least one of the second transistor and the third transistor comprises a polycrystalline semiconductor or a single crystal semiconductor.

20. The electro-optical display device according to claim 19, wherein the polycrystalline semiconductor is selected from polycrystalline silicon, polycrystalline silicon germanium, and polycrystalline germanium.

21. The electro-optical display device according to claim 19, wherein the single crystal semiconductor is selected from single crystal silicon, single crystal silicon germanium, and single crystal germanium.

22. The electro-optical display device according to claim 13, wherein the electro-optical display device comprises a blue phase liquid crystal.

23. The electro-optical display device according to claim 13, wherein a frame period is longer than or equal to 100 seconds.

24. The electro-optical display device according to claim 13, wherein time for writing of one screen in a frame is less than or equal to 0.2 milliseconds.

25. An electro-optical display device comprising a pixel, the pixel comprising:
a first transistor;
a second transistor;
a third transistor;
a capacitor; and
a display element,
wherein a source of the first transistor is connected to a gate of the second transistor, a gate of the third transistor, and one electrode of the capacitor,
wherein a source of the second transistor and a source of the third transistor are connected to one electrode of the display element,
wherein a gate of the first transistor and a drain of the third transistor are connected to a scan line,
wherein a drain of the second transistor and the other electrode of the capacitor are connected to a capacitor line,
wherein the second transistor is an N-channel transistor and the third transistor is a P-channel transistor,
wherein off-state current of the first transistor is less than or equal to 1/100 of leakage current of the display element, and
wherein capacitance of the capacitor is less than or equal to 1/10 of capacitance of the display element.

26. The electro-optical display device according to claim 25, wherein the first transistor is an N-channel transistor.

27. The electro-optical display device according to claim 25, wherein any one or two of the first transistor to the third transistor comprises an oxide semiconductor.

28. The electro-optical display device according to claim 27, wherein the oxide semiconductor comprises at least one of indium, gallium, and zinc.

29. The electro-optical display device according to claim 25, wherein at least one of the second transistor and the third transistor comprises a polycrystalline semiconductor or a single crystal semiconductor.

30. The electro-optical display device according to claim 29, wherein the single crystal semiconductor is selected from single crystal silicon, single crystal silicon germanium, and single crystal germanium.

31. The electro-optical display device according to claim 25, wherein the electro-optical display device comprises a blue phase liquid crystal.

32. The electro-optical display device according to claim 25, wherein a frame period is longer than or equal to 100 seconds.

33. The electro-optical display device according to claim 25, wherein time for writing of one screen in a frame is less than or equal to 0.2 milliseconds.

* * * * *